(12) United States Patent
Takamine et al.

(10) Patent No.: US 10,298,274 B2
(45) Date of Patent: *May 21, 2019

(54) MULTIPLEXER, TRANSMISSION DEVICE, AND RECEPTION DEVICE

(71) Applicant: Murata Manufacturing Co., Ltd., Nagaokakyo-shi, Kyoto-fu (JP)

(72) Inventors: Yuichi Takamine, Nagaokakyo (JP); Tsutomu Takai, Nagaokakyo (JP); Yuji Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/194,484

(22) Filed: Nov. 19, 2018

(65) Prior Publication Data

US 2019/0089387 A1    Mar. 21, 2019

Related U.S. Application Data

(63) Continuation of application No. 15/901,969, filed on Feb. 22, 2018, now Pat. No. 10,171,113.

(30) Foreign Application Priority Data

Feb. 23, 2017   (JP) ................................. 2017-031779

(51) Int. Cl.
*H04B 1/00* (2006.01)
*H04B 1/04* (2006.01)
(Continued)

(52) U.S. Cl.
CPC .......... *H04B 1/0057* (2013.01); *H03H 9/0009* (2013.01); *H03H 9/0014* (2013.01);
(Continued)

(58) Field of Classification Search
CPC .......... H04B 1/0057; H04B 1/04; H04B 3/21; H04B 1/1638; H04B 1/0458;
(Continued)

(56) References Cited

U.S. PATENT DOCUMENTS

2003/0006859 A1    1/2003  Taniguchi
2018/0241418 A1*   8/2018  Takamine ............. H03H 9/725

FOREIGN PATENT DOCUMENTS

KR    10-2002-0083443 A    11/2002

OTHER PUBLICATIONS

Takamine et al., "Multiplexer, Transmission Device, and Reception Device", U.S. Appl. No. 15/901,969, filed Feb. 22, 2018.

* cited by examiner

*Primary Examiner* — Eugene Yun
(74) *Attorney, Agent, or Firm* — Keating & Bennett, LLP

(57) ABSTRACT

A multiplexer includes filters, a common terminal with which an inductance element is connected to a connection path of the common terminal and an antenna element and a capacitance element is connected in series to the connection path, and another inductance element. An input terminal of one of the filters is connected to the common terminal via the another inductance element, and is connected to a parallel resonator. In each of the filters other than the one filter, one of the input terminal and the output terminal, which is a terminal closer to the antenna element, is connected to the common terminal, and is connected to the series resonator.

10 Claims, 18 Drawing Sheets

(51) Int. Cl.
*H04B 1/16*      (2006.01)
*H04B 3/21*      (2006.01)
*H03H 9/72*      (2006.01)
*H03H 9/00*      (2006.01)
*H03H 9/145*     (2006.01)
*H03H 9/64*      (2006.01)
*H03H 9/70*      (2006.01)
*H04B 1/18*      (2006.01)

(52) U.S. Cl.
CPC .......... *H03H 9/145* (2013.01); *H03H 9/6489* (2013.01); *H03H 9/703* (2013.01); *H03H 9/72* (2013.01); *H03H 9/725* (2013.01); *H04B 1/04* (2013.01); *H04B 1/1638* (2013.01); *H04B 3/21* (2013.01); *H04B 1/0458* (2013.01); *H04B 1/18* (2013.01); *H04B 2001/0408* (2013.01)

(58) Field of Classification Search
CPC ............. H04B 2001/0408; H04B 1/18; H03H 9/0009; H03H 9/145; H03H 9/0014; H03H 9/72
USPC ...................................................... 455/90.2
See application file for complete search history.

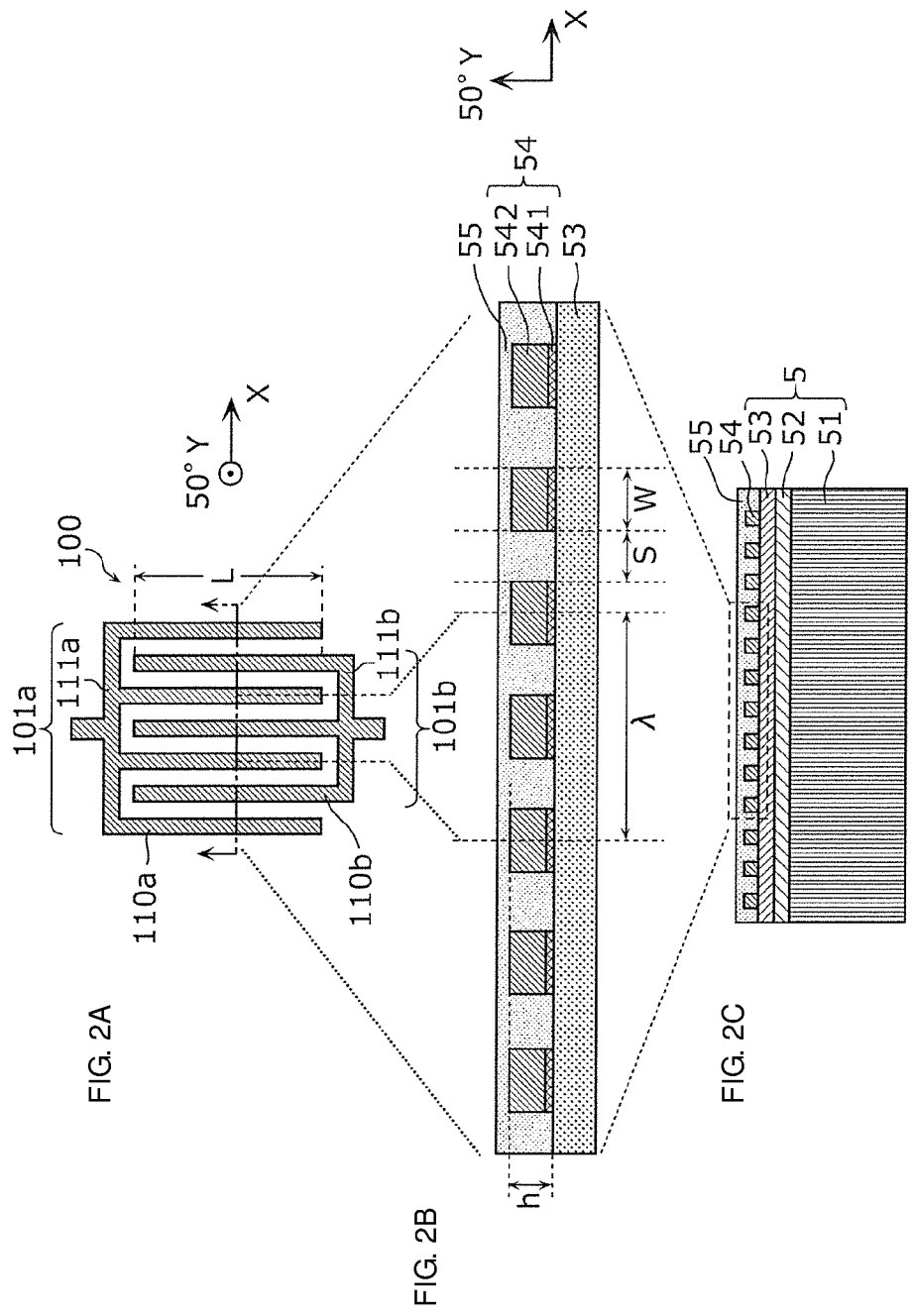

Band25Tx

Band25Rx

Band66Tx

Band66Rx

FIG. 6C
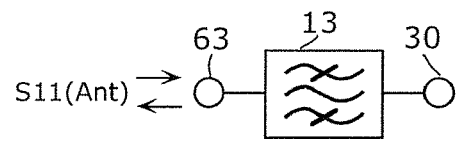
Band66Tx
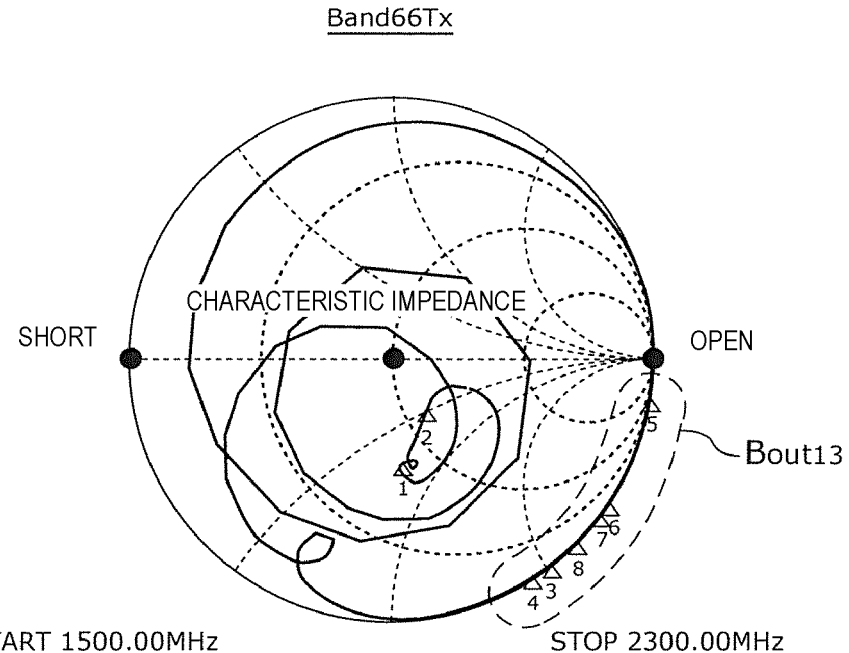

FIG. 6D
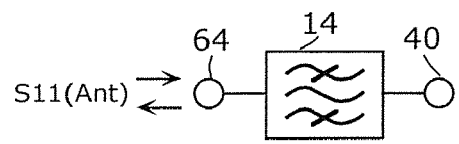
Band66Rx
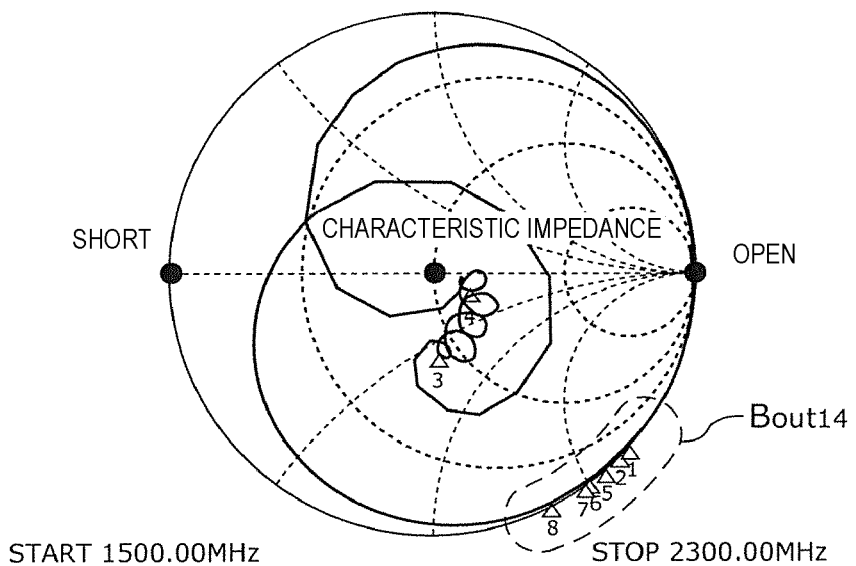
| MARKER1:Band66Tx(1710MHz) |
| MARKER2:Band66Tx(1780MHz) |
| MARKER3:Band66Rx(2110MHz) |
| MARKER4:Band66Rx(2200MHz) |
| MARKER5:Band25Tx(1850MHz) |
| MARKER6:Band25Tx(1915MHz) |
| MARKER7:Band25Rx(1930MHz) |
| MARKER8:Band25Rx(1995MHz) |

START 1500.00MHz STOP 2300.00MHz

| MARKER1:Band66Tx(1710MHz) | MARKER5:Band25Tx(1850MHz) |
| MARKER2:Band66Tx(1780MHz) | MARKER6:Band25Tx(1915MHz) |
| MARKER3:Band66Rx(2110MHz) | MARKER7:Band25Rx(1930MHz) |
| MARKER4:Band66Rx(2200MHz) | MARKER8:Band25Rx(1995MHz) |

START 1500.00MHz  STOP 2300.00MHz

| MARKER1:Band66Tx(1710MHz) | MARKER5:Band25Tx(1850MHz) |
| MARKER2:Band66Tx(1780MHz) | MARKER6:Band25Tx(1915MHz) |
| MARKER3:Band66Rx(2110MHz) | MARKER7:Band25Rx(1930MHz) |
| MARKER4:Band66Rx(2200MHz) | MARKER8:Band25Rx(1995MHz) |

MULTIPLEXER, TRANSMISSION DEVICE, AND RECEPTION DEVICE

CROSS REFERENCE TO RELATED APPLICATIONS

This application claims the benefit of priority to Japanese Patent Application No. 2017-031779 filed on Feb. 23, 2017. The entire contents of this application are hereby incorporated herein by reference.

BACKGROUND OF THE INVENTION

1. Field of the Invention

The present invention relates to a multiplexer including an elastic wave filter, a transmission device, and a reception device.

2. Description of the Related Art

In recent years, there has been a demand for cellular phones to be able to handle multiple frequency bands and multiple wireless formats with a single terminal, i.e., to have multi-band and multi-mode capabilities. To this end, a multiplexer is disposed immediately beneath a single antenna, to demultiplex high-frequency signals having multiple wireless carrier frequencies. An elastic wave filter having low loss in the passband, and steep passband characteristics around the passband, is used as the multiple passband filters defining the multiplexer.

International Publication No. 2016/208670 discloses a surface acoustic wave device (SAW duplexer) having a configuration in which multiple surface acoustic wave filters are connected. Specifically, an inductance element is connected in series between a connection path to an antenna terminal of a reception-side surface acoustic wave filter and a transmission-side surface acoustic wave filter, and an antenna element, to enable impedance matching between the antenna element and antenna terminal. This inductance element enables complex impedance, when viewing the surface acoustic wave filter from the antenna terminal to which multiple surface acoustic wave filters that have capacitance are connected, to be brought closer to the characteristic impedance. Thus, International Publication No. 2016/208670 describes that deterioration of insertion loss is able to be prevented.

Regarding connection of a transmission terminal of a transmission-side surface acoustic wave filter to a power amplifier (PA) and a reception terminal of a reception-side surface acoustic wave filter to a low-noise amplifier (LNA), the characteristic impedance of the transmission terminal of the transmission-side surface acoustic wave filter and the reception terminal of the reception-side surface acoustic wave filter is sometimes designed to match the respective PA and LNA in recent years, in order to reduce the number of matching elements to perform impedance matching. However, the characteristic impedance of the antenna-side terminal of the transmission-side surface acoustic wave filter and the reception-side surface acoustic wave filter is 50Ω, and therefore, the characteristic impedance may be different between the transmission terminal or the reception terminal side of the surface acoustic wave filter and the antenna terminal side. The surface acoustic wave device and impedance matching method described in International Publication No. 2016/208670 is not able to sufficiently match impedance for each terminal in this case, and there is a problem that insertion loss increases.

SUMMARY OF THE INVENTION

Preferred embodiments of the present invention provide multiplexer, transmission devices, and reception devices, capable of reducing insertion loss in the passband of each elastic wave filter, even when the characteristic impedance is different between the transmission terminal or the reception terminal side of the surface acoustic wave filter and the antenna terminal side.

According to a preferred embodiment of the present invention, a multiplexer that transmits and receives high-frequency signals via an antenna element includes a plurality of elastic wave filters with passbands different from each other; a common terminal, with which at least one first circuit element is connected between a connection path of the common terminal and the antenna element, and a reference terminal, and at least one second circuit element is connected in series to the connection path; and a first inductance element. Each of the plurality of elastic wave filters includes at least one of a series resonator connected between an input terminal and an output terminal, and a parallel resonator connected between a connection path connecting the input terminal and the output terminal, and a reference terminal. Regarding one elastic wave filter of the plurality of elastic wave filters, one of the input terminal and the output terminal of the elastic wave filter, which is a terminal closer of to the antenna element, is connected to the common terminal via the first inductance element that is connected to the terminal close to the antenna element and the common terminal, and the terminal close to the antenna element is connected to the parallel resonator. Regarding the elastic wave filters other than the one elastic wave filter among the plurality of elastic wave filters, one of the input terminal and the output terminal of the elastic wave filter, which is a terminal closer of to the antenna element, is connected to the common terminal, and is connected to the series resonator.

According to this configuration, freedom in impedance matching is improved in accordance with the types, characteristics, connection positions, and combinations of the first circuit element and the second circuit element. Thus, even when the characteristic impedance differs between the transmission terminal or the reception terminal of the elastic wave filter side and the antenna terminal side, sufficient impedance matching is able to be performed for each terminal. Accordingly, insertion loss in the passband of each elastic wave filter of the multiplexer is able to be reduced. Thus, there is no need to provide a matching element between each elastic wave filter and a PA or LNA, and a high-frequency circuit is able to be provided with a simple configuration.

Impedance of bands other than the band of the one elastic wave filter may become inductive due to the first inductance element being connected to the terminal of the one elastic wave filter closer to the antenna element.

According to this structure, the complex impedance is able to be easily adjusted to the characteristic impedance using the complex conjugate relationship. Thus, sufficient impedance matching is able to be performed for each terminal, even when the characteristic impedance differs between the transmission terminal or the reception terminal of the elastic wave filter side and the antenna side. Accordingly, insertion loss in the passband of each elastic wave filter of the multiplexer is able to be reduced.

The first circuit element or the second circuit element connected to the side closest to the common terminal may be an inductance element.

Accordingly, when the real part of the characteristic impedance when viewed from the common terminal side is below about 50Ω, and also the characteristic impedance of the passband of the multiplexer is in the third quadrant or fourth quadrant of a Smith chart, the characteristic impedance is able to be sufficiently matched for each terminal. Particularly, when the real part of the characteristic impedance when viewed from the common terminal side is below about 50Ω, and also the characteristic impedance of the passband of the multiplexer is in the third quadrant or fourth quadrant of a Smith chart, insertion loss in the passband of each elastic wave filter of the multiplexer is able to be reduced.

The first circuit element may be an inductance element, and the second circuit element may be a capacitance element, for example.

Accordingly, when the real part of the characteristic impedance when viewed from the common terminal side is below about 50Ω, and also the characteristic impedance of the passband of the multiplexer is in the fourth quadrant of a Smith chart, the characteristic impedance is able to be sufficiently matched for each terminal. Particularly, when the real part of the characteristic impedance when viewed from the common terminal side is below about 50Ω, and also the characteristic impedance of the passband of the multiplexer is in the fourth quadrant of a Smith chart, insertion loss in the passband of each elastic wave filter of the multiplexer is able to be reduced.

The first circuit element may be a capacitance element, and the second circuit element may be an inductance element, for example.

Accordingly, when the real part of the characteristic impedance when viewed from the common terminal side is below about 50Ω, and also the characteristic impedance of the passband of the multiplexer is in the third quadrant of a Smith chart, and when the real part of the characteristic impedance when viewed from the common terminal side is about 50Ω or above, and also the characteristic impedance of the passband of the multiplexer is in the third quadrant or fourth quadrant of a Smith chart, the characteristic impedance is able to be sufficiently matched for each terminal. Particularly, when the real part of the characteristic impedance when viewed from the common terminal side is below about 50Ω, and also the characteristic impedance of the passband of the multiplexer is in the third quadrant of a Smith chart, and when the real part of the characteristic impedance when viewed from the common terminal side is about 50Ω or above, and also the characteristic impedance of the passband of the multiplexer is in the third quadrant or fourth quadrant of a Smith chart, insertion loss in the passband of each elastic wave filter of the multiplexer is able to be reduced.

Of the input terminal and the output terminal of each of the plurality of elastic wave filters, characteristic impedances of the terminal on the opposite side from the terminal closer to the antenna element may be different from each other.

Accordingly, the characteristic impedance of each elastic wave filter of the multiplexer is able to be adjusted, and therefore, insertion loss in the passband for characteristic impedance of each elastic wave filter is able to be appropriately reduced.

An elastic wave filter, of the plurality of elastic wave filters, that needs isolation from the one elastic wave filter may include a second inductance element connected in series or in parallel at the terminal on the opposite side from the terminal closer to the antenna element.

Accordingly, isolation of the elastic wave filter where the second inductance element is provided is able to be increased by using coupling between the second inductance element and the other inductance element.

Complex impedance at a predetermined passband, in a state in which the first inductance element and one of the input terminal and the output terminal of the one elastic wave filter which is the terminal closer to the antenna element are connected in series, when viewing the one elastic wave filter alone via the first inductance element, and complex impedance at the predetermined passband, in a state in which one of the input terminal and the output terminal of each of the elastic wave filters other than the one elastic wave filter which is the terminal closer to the antenna element is connected to the common terminal, when viewing the elastic wave filters other than the one elastic wave filter from the side of the terminal closer to the antenna element and connected to the common terminal, may be in a complex conjugate relationship.

Accordingly, complex impedance viewed from the common terminal of the multiplexer including the composited circuit, where the circuit in which the first inductance element and one elastic wave filter have been connected in series, and the circuit where the elastic wave filters other than the one elastic wave filter have been connected in parallel at the common terminal, have been composited, is able to be made to match the characteristic impedance while securing low loss within the passband. Connecting the first inductance element in series between the common terminal and the antenna element enables fine adjustment of the complex impedance of the multiplexer when viewed from the common terminal to the induction side.

A piezoelectric substrate of each of the plurality of elastic wave filters may include a piezoelectric film on one surface of which an interdigital transducer (IDT) electrode is provided, a high-acoustic-velocity supporting substrate in which a bulk wave acoustic velocity propagating through the high-acoustic-velocity supporting substrate is faster than an elastic wave velocity propagating through the piezoelectric film, and a low-acoustic-velocity film that is disposed between the high-acoustic-velocity supporting substrate and the piezoelectric film, where a bulk wave acoustic velocity propagating through the low-acoustic-velocity film is slower than a bulk wave acoustic velocity propagating through the piezoelectric film.

Circuit elements, such as an inductance element and capacitance element, may be included to perform impedance matching between the multiple elastic wave filters, such as a case in which the first inductance element is connected in series at the common terminal side of the one elastic wave filter. In this case, a situation is conceivable in which the Q values of the resonators are equivalently reduced. However, with the laminated structure of the piezoelectric substrate, the Q values of the resonators are able to be maintained at high values. Accordingly, an elastic wave filter that has low in-band loss is able to be provided.

The multiplexer may include, as the plurality of elastic wave filters, a first elastic wave filter that has a first passband, and outputs transmission signals to the antenna element, a second elastic wave filter that has a second passband adjacent to the first passband, and receives reception signals from the antenna element, a third elastic wave filter that has a third passband on the lower frequency side from the first passband and the second passband, and outputs transmission signals to the antenna element, and a fourth elastic wave filter that has a fourth passband on the higher frequency side from the first passband and the second passband, and receives reception signals from the antenna element, the one elastic wave filter to which the first inductance element is connected in series being at least one of the second elastic wave filter and the fourth elastic wave filter.

According to a preferred embodiment of the present invention, a transmission device receives a plurality of high-frequency signals with carrier frequency bands that are different from each other, filters the plurality of high-frequency signals, and wirelessly transmits signals from a common antenna element. The transmission device includes a plurality of transmitting elastic wave filters that receive the plurality of high-frequency signals from a transmission circuit, and pass only a predetermined frequency band; and a common terminal, with which at least one first circuit element is connected between a connection path of the common terminal and the antenna element, and a reference terminal, and at least one second circuit element is connected in series to the connection path. Each of the plurality of transmitting elastic wave filters includes at least one of a series resonator connected between an input terminal and an output terminal, and a parallel resonator connected between a connection path connecting the input terminal and the output terminal, and a reference terminal. An output terminal of one of the plurality of transmitting elastic wave filters is connected to the common terminal via an inductance element that is connected to the output terminal and to the common terminal, and the output terminal is connected to the parallel resonator. An output terminal of the transmitting elastic wave filters other than the one transmitting elastic wave filter, is connected to the common terminal, and is connected to the series resonator among the series resonator and the parallel resonator.

According to a preferred embodiment of the present invention, a reception device receives a plurality of high-frequency signals with carrier frequency bands that are different from each other via an antenna element, demultiplexes the plurality of high-frequency signals, and outputs signals to a reception circuit. The reception device includes a plurality of receiving elastic wave filters that receive the plurality of high-frequency signals from the antenna element, and pass only a predetermined frequency band; and a common terminal, with which at least one first circuit element is connected between a connection path of the common terminal and the antenna element, and a reference terminal, and at least one second circuit element is connected in series to the connection path. Each of the plurality of receiving elastic wave filters includes at least one of a series resonator connected between an input terminal and an output terminal, and a parallel resonator connected between a connection path connecting the input terminal and the output terminal, and a reference terminal. An input terminal of one of the plurality of receiving elastic wave filters is connected to the common terminal via an inductance element that is connected to the input terminal and to the common terminal, and the input terminal is connected to the parallel resonator. An input terminal of the receiving elastic wave filters other than the one receiving elastic wave filter, is connected to the common terminal, and is connected to the series resonator among the series resonator and the parallel resonator.

According to a preferred embodiment of the present invention, an impedance matching method of a multiplexer that transmits and receives a plurality of high-frequency signals via an antenna element includes adjusting a plurality of elastic wave filters with passbands that are different from each other, such that when viewing one elastic wave filter from one of an input terminal and an output terminal of the one elastic wave filter, complex impedance at passbands of the other elastic wave filters is in a short state, and when viewing each of the other elastic wave filters than the one elastic wave filter from one of the input terminal and the output terminal of each of the other elastic wave filters alone, complex impedance at passbands of the other elastic wave filters is in an open state; adjusting inductance values of a filter matching inductance element such that complex impedance when the filter matching inductance element is connected in series to the one elastic wave filter, when viewing the one elastic wave filter from the filter matching inductance element side, and complex impedance when the elastic wave filters other than the one elastic wave filter are connected in parallel to the common terminal, when viewing the other elastic wave filters from the common terminal side, are in a complex conjugate relationship; and adjusting, in a compositing circuit in which the one elastic wave filter is connected to the common terminal via the filter matching inductance element and the other elastic wave filters are connected to the common terminal in parallel, at least one first circuit element connected between a connection path of the antenna element and the common terminal, and a reference terminal, and at least one second circuit element connected in series to the connection path of the antenna element and the common terminal, such that complex impedance when viewed from the common terminal matches a characteristic impedance. In the adjusting of the plurality of elastic wave filters, among the plurality of elastic wave filters including at least one of a series resonator connected between an input terminal and an output terminal, and a parallel resonator connected between a connection path connecting the input terminal and the output terminal and a reference terminal, at the one elastic wave filter, the parallel resonator and the series resonator are arrayed so that the parallel resonator is connected to the filter matching inductance element, and at the other elastic wave filters, the parallel resonator and the series resonator are arrayed so that the series resonator, of the parallel resonator and the series resonator, is connected to the common terminal.

Accordingly, freedom in impedance matching is improved in accordance with the types, characteristics, connection positions, and combinations of the first circuit element and the second circuit element. Thus, even when the characteristic impedance differs between the transmission terminal or the reception terminal of the elastic wave filter side and the antenna terminal side, sufficient impedance matching is able to be performed for each terminal.

With the multiplexers, transmission devices, and reception devices according to preferred embodiments of the present invention, even when the characteristic impedance differs between the transmission terminal or the reception terminal of the elastic wave filter side and the antenna terminal side, insertion loss in the passband of each elastic wave filter is able to be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A through 2C are diagrams schematically representing a resonator of a surface acoustic wave filter according to Preferred Embodiment 1 of the present invention, where FIG. 2A is a plan view and FIGS. 2B and 2C are cross-sectional views.

FIG. 6C is a Smith chart representing complex impedance as viewed from the transmission output terminal of a Band 66 transmission-side filter alone according to Preferred Embodiment 1 of the present invention.

FIG. 6D is a Smith chart representing complex impedance as viewed from the reception input terminal of a Band 66 reception-side filter alone according to Preferred Embodiment 1 of the present invention.

DETAILED DESCRIPTION OF THE PREFERRED EMBODIMENTS

Figure 1:
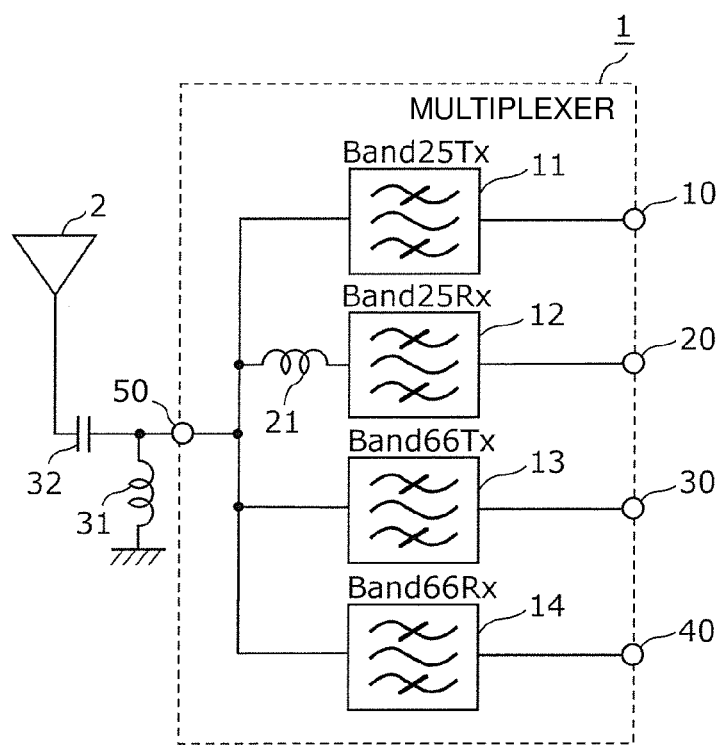
FIG. 1 is a circuit configuration diagram of a multiplexer according to Preferred Embodiment 1 of the present invention.

Preferred embodiments of the present invention will be described in detail below with reference to the drawings. Note that the preferred embodiments described below are each general or specific examples. Values, shapes, materials, components, placements, and connected states of components, and so forth, illustrated in the following preferred embodiments, are only exemplary, and do not restrict the present invention. Components in the following preferred embodiments which are not included in an independent claim are described as being optional components. The sizes and proportion of sizes of components illustrated in the drawings are not necessarily precisely to scale.

Preferred Embodiment 1

A quadplexer applied to Band 25 (transmission passband of about 1850 MHz to about 1915 MHz, reception passband of about 1930 MHz to about 1995 MHz) and Band 66

(transmission passband of about 1710 MHz to about 1780 MHz, reception passband of about 2010 MHz to about 2200 MHz) in the Time Division Long Term Evolution (TD-LTE) standard is exemplified in Preferred Embodiment 1 of the present invention.

The multiplexer 1 according to the present preferred embodiment is preferably a quadplexer in which a Band 25 duplexer and a Band 66 duplexer are connected at a common terminal 50.

FIG. 1 is a circuit configuration diagram of a multiplexer 1 according to the present preferred embodiment. The multiplexer 1 includes transmission-side filters 11 and 13, reception-side filters 12 and 14, an inductance element 21, the common terminal 50, transmission input terminals 10 and 30, and reception output terminals 20 and 40, as illustrated in FIG. 1. The multiplexer 1 is connected to an antenna element 2 at the common terminal 50. An inductance element 31 is connected between the connection path of the common terminal 50 and antenna element 2, and the ground that is a reference terminal. A capacitance element 32 is connected in series on the connection path of the common terminal 50 and antenna element 2. The inductance element 31 is connected closer to the common terminal 50 side than the capacitance element 32.

In the present preferred embodiment, the inductance element 31 is equivalent to a first circuit element, the capacitance element 32 is equivalent to a second circuit element, and the inductance element 21 is equivalent to a first inductance element. The inductance element 31 and capacitance element 32 may be included in the multiplexer 1 or may be externally attached to the multiplexer 1. A configuration may be provided in which the capacitance element 32 is connected closer to the common terminal 50 side than the inductance element 31.

The transmission-side filter 11 is preferably a non-equilibrium-input/non-equilibrium-output bandpass filter (first elastic wave filter), for example, that receives transmission waves generated at a transmission circuit (Radio Frequency Integrated Circuit (RFIC) or other suitable circuit, for example) via the transmission input terminal 10, filters the transmission waves at the Band 25 transmission passband (about 1850 MHz to about 1915 MHz: first passband), and outputs to the common terminal 50.

The reception-side filter 12 is preferably a non-equilibrium-input/non-equilibrium-output bandpass filter (second elastic wave filter), for example, that receives reception waves from the common terminal 50, filters the reception waves at the Band 25 reception passband (about 1930 MHz to about 1995 MHz: second passband), and outputs to the reception output terminal 20. The inductance element 21 is connected in series between the reception-side filter 12 and the common terminal 50. Due to the inductance element 21 being connected to the common terminal 50 side of the reception-side filter 12, the impedances of the transmission-side filters 11 and 13 and the reception-side filter 14 that have passbands outside of the passband of the reception-side filter 12 are inductive.

The transmission-side filter 13 is preferably a non-equilibrium-input/non-equilibrium-output bandpass filter (third elastic wave filter), for example, that receives transmission waves generated at a transmission circuit (RFIC or other suitable circuit, for example) via the transmission input terminal 30, filters the transmission waves at the Band 66 transmission passband (about 1710 MHz to about 1780 MHz: third passband), and outputs to the common terminal 50.

The reception-side filter 14 is preferably a non-equilibrium-input/non-equilibrium-output bandpass filter (fourth elastic wave filter), for example, that receives reception waves from the common terminal 50, filters the reception waves at the Band 66 reception passband (about 2010 MHz to about 2200 MHz: fourth passband), and outputs to the reception output terminal 40.

The transmission-side filters 11 and 13 and the reception-side filter 14 are directly connected to the common terminal 50.

Note that the inductance element 21 is not restricted to being connected between the reception-side filter 12 and the common terminal 50, and may be connected in series between the reception-side filter 14 and the common terminal 50.

The structure of a surface acoustic wave resonator defining the transmission-side filters 11 and 13 and the reception-side filters 12 and 14 will now be described.

FIGS. 2A through 2C are schematic diagrams schematically illustrating a resonator of a surface acoustic wave filter according to the present preferred embodiment. FIG. 2A is a plan view, and FIGS. 2B and 2C are cross-sectional views taken along the single-dot dashed line in FIG. 2A. FIGS. 2A through 2C are a schematic plan view and schematic cross-sectional views exemplarily illustrating, out of the plurality of resonators defining the transmission-side filters 11 and 13 and the reception-side filters 12 and 14, the structure of the series resonator of the transmission-side filter 11. Note that the series resonator in FIGS. 2A through 2C is illustrated for the purpose of describing a typical structure of the aforementioned plurality of resonators, so the number, length, and other parameters, of electrode fingers defining the electrodes are not restricted to this illustration.

A resonator 100 that defines the transmission-side filters 11 and 13 and the reception-side filters 12 and 14 includes a piezoelectric substrate 5, and comb-shaped interdigital transducer (IDT) electrodes 101a and 101b.

The pair of IDT electrodes 101a and 101b are provided on the piezoelectric substrate 5 facing each other, as illustrated in FIG. 2A. The IDT electrode 101a includes a plurality of electrode fingers 110a that are parallel or substantially parallel to each other, and a busbar electrode 111a that connects the plurality of electrode fingers 110a. The IDT electrode 101b includes a plurality of electrode fingers 110b that are parallel or substantially parallel to each other, and a busbar electrode 111b that connects the plurality of electrode fingers 110b. The plurality of electrode fingers 110a and 110b extend in a direction orthogonal or substantially orthogonal to the X-axial direction.

IDT electrodes 54 defined by the plurality of electrode fingers 110a and 110b and busbar electrodes 111a and 111b preferably have a laminated structure including a close contact layer 541 and a main electrode layer 542, as illustrated in FIG. 2B, for example.

The close contact layer 541 is a layer to improve close contact between the piezoelectric substrate 5 and the main electrode layer 542. An example of material used for the close contact layer 541 is titanium (Ti). The film thickness of the close contact layer 541 is preferably about 12 nm, for example.

An example of a material used for the main electrode layer 542 is aluminum (Al) including about 1% copper (Cu), for example. The film thickness of the main electrode layer 542 is preferably about 162 nm, for example.

A protective layer 55 covers the IDT electrodes 101a and 101b. The protective layer 55 is a layer provided to protect the main electrode layer 542 from the ambient environment, to adjust frequency-temperature characteristics, to improve humidity withstanding capabilities, and so forth, and is preferably a film of which the primary component is silicon dioxide, for example. The thickness of the protective layer 55 is preferably about 25 nm, for example.

The materials from which the close contact layer 541, main electrode layer 542, and protective layer 55 are made are not restricted to the aforementioned materials. Further, the IDT electrodes 54 does not necessarily have the above-described laminated structure. The IDT electrodes 54 may be made from, for example, Ti, Al, Cu, platinum (Pt), gold (Au), silver (Ag), palladium (Pd), other suitable metals or alloys, and may include a plurality of laminated articles defined by the above metals or alloys. Further, the protective layer 55 is not required.

Next, the laminated structure of the piezoelectric substrate 5 will be described.

The piezoelectric substrate 5 includes a high-acoustic-velocity supporting substrate 51, a low-acoustic-velocity film 52, and a piezoelectric film 53, as illustrated in FIG. 2C. The structure is such that the high-acoustic-velocity supporting substrate 51, the low-acoustic-velocity film 52, and the piezoelectric film 53 are layered in this order.

The piezoelectric film 53 is preferably, for example, a 50° Y-cut X-propagation lithium tantalite (LiTaO$_3$) piezoelectric crystal or piezoelectric ceramic (a LiTaO$_3$ monocrystal cut along a face where an axis rotated about 50° from the Y axis on the X axis is the normal or a ceramic, being a monocrystal where surface acoustic waves propagate in the X-axial direction or a ceramic). The thickness of the piezoelectric film 53 is preferably about 600 nm, for example. Note that a piezoelectric film 53 made of a 42° to 45° Y-cut X-propagation LiTaO$_3$ piezoelectric crystal or piezoelectric ceramic is preferably used for the transmission-side filter 13 and reception-side filter 14, for example.

The high-acoustic-velocity supporting substrate 51 supports the low-acoustic-velocity film 52, the piezoelectric film 53, and the IDT electrodes 54. The high-acoustic-velocity supporting substrate 51 further is a substrate in which the acoustic velocity of bulk waves in the high-acoustic-velocity supporting substrate 51 is faster than the elastic waves of surface waves or boundary waves propagating through the piezoelectric film 53, functioning to confine surface acoustic waves in the portion in which the piezoelectric film 53 and low-acoustic-velocity film 52 are layered, so as to not leak below the high-acoustic-velocity supporting substrate 51. The high-acoustic-velocity supporting substrate 51 is preferably a silicon substrate, for example, the thickness thereof preferably being about 200 μm, for example.

The low-acoustic-velocity film 52 is a film in which the acoustic velocity of bulk waves in the low-acoustic-velocity film is slower than that of bulk waves propagating through the piezoelectric film 53, and is disposed between the piezoelectric film 53 and the high-acoustic-velocity supporting substrate 51. This structure, and the nature of elastic waves where energy is concentrated in an essentially low-acoustic-velocity medium, reduces or prevents leakage of surface acoustic wave energy to the outside of the IDT electrodes. The low-acoustic-velocity film 52 is a film of which the primary component is preferably silicon dioxide, for example, and the thickness thereof is preferably about 670 nm, for example.

According to the above-described laminated structure of the piezoelectric substrate 5, the Q value in the resonant frequency and anti-resonant frequency is able to be significantly increased as compared to a structure used heretofore of a single-layer piezoelectric substrate. That is to say, a surface acoustic wave resonator with a high Q value is provided, such that a filter having small insertion loss is able to be provided using this surface acoustic wave resonator.

Further, impedance is matched between the plurality of surface acoustic wave filters, such as a case of connecting the inductance element 21 in series for impedance matching to the common terminal 50 side of the reception-side filter 12, such that circuit elements, such as inductance elements and capacitance elements, for example, are added. Cases are conceivable in which this would equivalently reduce the Q value of the resonator 100. However, even in such cases, the Q value of the resonator 100 is able to be maintained at a high value due to the above-described laminated configuration of the piezoelectric substrate 5. Accordingly, a surface acoustic wave filter having low in-band loss is provided.

Note that the high-acoustic-velocity supporting substrate 51 may have a structure in which a supporting substrate, and a high-acoustic velocity film in which the acoustic velocity of propagating bulk waves is faster than the elastic waves of surface waves or boundary waves propagating through the piezoelectric film 53, are laminated. Examples of materials that may be used for the supporting substrate in this case include piezoelectric materials, such as sapphire, lithium tantalite, lithium niobate, crystal, and other suitable piezoelectric materials, dielectric materials, such as various types of ceramics such as alumina, magnesia, silicon nitride, aluminum nitride, silicon carbide, zirconia, cordierite, mullite, steatite, forsterite, and other suitable dielectric materials, glass, semiconductors, such as silicon, gallium nitride, and other suitable semiconductors, and resin substrate. Examples of materials that may be used for the high-acoustic-velocity film include aluminum nitride, aluminum oxide, silicon carbide, silicon nitride, silicon oxynitride, diamond-like carbon (DLC) or diamond, mediums of which the above materials are the primary component, mediums of which mixtures of the above materials are the primary component, and other various high-acoustic-velocity materials.

Note that in FIGS. 2A and 2B, λ represents the pitch of the plurality of electrode fingers 110a and 110b of the IDT electrodes 101a and 101b, L represents the overlap width of the IDT electrodes 101a and 101b, W represents the width of the electrode fingers 110a and 110b, S represents the width between the electrode fingers 110a and 110b, and h represents the height of the IDT electrodes 101a and 101b.

The circuit configuration of the filters will be described below with reference to FIGS. 3A through 4.

Figure 3A:
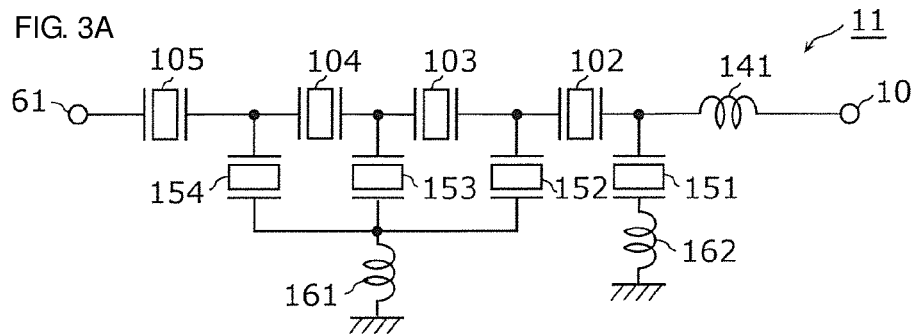
FIG. 3A is a circuit configuration diagram of Band 25 transmission-side filter of the multiplexer according to Preferred Embodiment 1 of the present invention.

FIG. 3A is a circuit configuration diagram of the Band 25 transmission-side filter 11 of the multiplexer 1 according to the present preferred embodiment. The transmission-side filter 11 includes series resonators 102 through 105, parallel resonators 151 through 154, and inductance elements 141, 161, and 162 to perform matching, as illustrated in FIG. 3A.

The series resonators 102 through 105 are connected in series to each other between the transmission input terminal 10 and a transmission output terminal 61. The parallel resonators 151 through 154 are connected to each other in parallel between contact points of the transmission input terminal 10, the transmission output terminal 61, and the series resonators 102 through 105, and reference terminals (ground). The transmission-side filter 11 is preferably a ladder bandpass filter, for example, due to the above-described configuration of the series resonators 102 through 105 and parallel resonators 151 through 154.

The inductance element 141 is connected in series between the transmission input terminal 10 and the series resonator 102, and between the transmission input terminal 10 and the parallel resonator 151. The inductance element 141 is a second inductance element, and the transmission-side filter 11 that requires isolation from the reception-side filter 12 to which the inductance element 21 is connected, which will be described later, includes the inductance element 141 connected in series to the transmission input terminal 10 on the opposite side from the common terminal 50 connected to the antenna element 2. Note that the inductance element 141 may be connected between the connection path of the transmission input terminal 10 and the series resonator 102 and the reference terminal. Providing the inductance element 141 enables the isolation of the transmission-side filter 11 to be increased, by using the coupling of the inductance element 141 and the other inductance elements 161 and 162.

The inductance element 161 is connected between the contact points of the parallel resonators 152, 153, and 154, and the reference terminal. The inductance element 162 is connected between the parallel resonator 151 and the reference terminal.

The transmission output terminal 61 is connected to the common terminal 50 (see FIG. 1). The transmission output terminal is also connected to the series resonator 105, and is not directly connected to any of the parallel resonators 151 through 154.

Figure 3B:
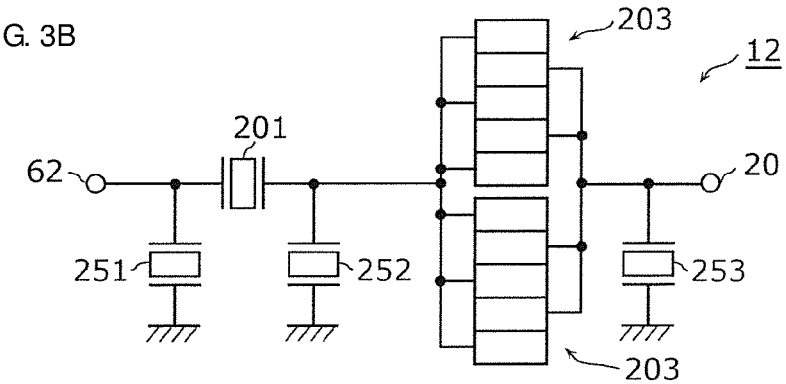
FIG. 3B is a circuit configuration diagram of Band 25 reception-side filter of the multiplexer according to Preferred Embodiment 1 of the present invention.
Figure 3C:
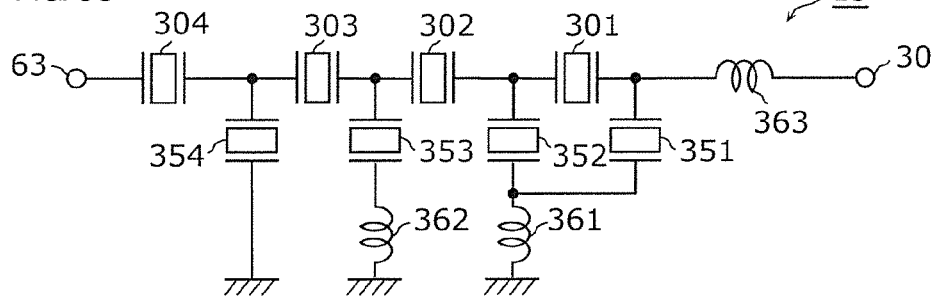
FIG. 3C is a circuit configuration diagram of Band 66 transmission-side filter of the multiplexer according to Preferred Embodiment 1 of the present invention.

FIG. 3C is a circuit configuration diagram of the Band 66 transmission-side filter 13 of the multiplexer 1 according to the present preferred embodiment. The transmission-side filter 13 includes series resonators 301 through 304, parallel resonators 351 through 354, and inductance elements 361 through 363 to perform matching, as illustrated in FIG. 3C.

The series resonators 301 through 304 are connected in series between a transmission input terminal 30 and a transmission output terminal 63. The parallel resonators 351 through 354 are connected in parallel to each other between contact points of the transmission input terminal 30, the transmission output terminal 63, and the series resonators 301 through 304, and reference terminals (ground). The transmission-side filter 13 is a ladder bandpass filter due to the above-described configuration of the series resonators 301 through 304 and parallel resonators 351 through 354. An inductance element 361 is connected between the connection point of the parallel resonators 351 and 352 and a reference terminal. An inductance element 362 is connected between the parallel resonator 353 and a reference terminal. An inductance element 363 is connected between the transmission input terminal and series resonator 301. The inductance element 363 is a second inductance element, the same as or similar to the inductance element 141 in the above-described transmission-side filter 11. The inductance element 363 may be connected between the connection path of the transmission input terminal 30 and the series resonator 301, and the reference terminal.

The transmission output terminal 63 is connected to the common terminal 50 (see FIG. 1). The transmission output terminal is also connected to the series resonator 304, and is not directly connected to any of the parallel resonators 351 through 354.

Note that PA (omitted from illustration), for example, is connected to the transmission input terminals 10 and 30. The characteristic impedance of the transmission input terminals 10 and 30 may differ in accordance with the characteristics of the PA that is connected thereto.

FIG. 3B is a circuit configuration diagram of the Band 25 reception-side filter 12 of the multiplexer 1 according to the present preferred embodiment. The reception-side filter 12 preferably includes, for example, a longitudinally coupled resonator surface acoustic wave unit, as illustrated in FIG. 3B. More specifically, the reception-side filter 12 includes a longitudinally coupled filter unit 203, a series resonator 201, and parallel resonators 251 through 253.

Figure 4:
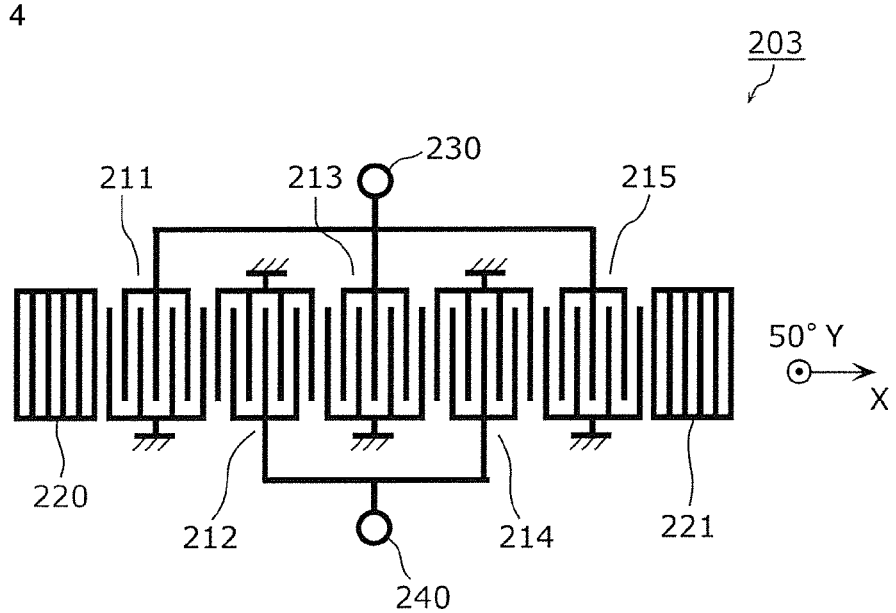
FIG. 4 is a schematic plan view illustrating the electrode configuration of a longitudinally coupled surface acoustic wave filter according to Preferred Embodiment 1 of the present invention.

FIG. 4 is a schematic plan view illustrating the electrode configuration of the longitudinally coupled filter unit 203 according to the present preferred embodiment. The longitudinally coupled filter unit 203 includes IDTs 211 through 215, reflectors 220 and 221, an input port 230, and an output port 240, as illustrated in FIG. 4.

The IDTs 211 through 215 each include a pair of IDT electrodes that face each other. IDTs 212 and 214 are positioned with IDT 213 interposed therebetween in the X direction, and IDTs 211 and 215 are positioned with IDTs 212 through 214 interposed therebetween in the X direction. The reflectors 220 and 221 are disposed with the IDTs 211 through 215 interposed therebetween in the X direction. The IDTs 211, 213, and 215 are connected in parallel between the input port 230 and reference terminal (ground), and the IDTs 212 and 214 are connected in parallel between the output port 240 and reference terminal.

It can be seen from FIG. 3B that the series resonator 201 and the parallel resonators 251 and 252 define a ladder filter unit.

The transmission input terminal 62 is connected to the common terminal 50 (see FIG. 1) via the inductance element 21 (see FIG. 1). The transmission input terminal 62 is also connected to the parallel resonator 251, as illustrated in FIG. 3B.

Figure 3D:
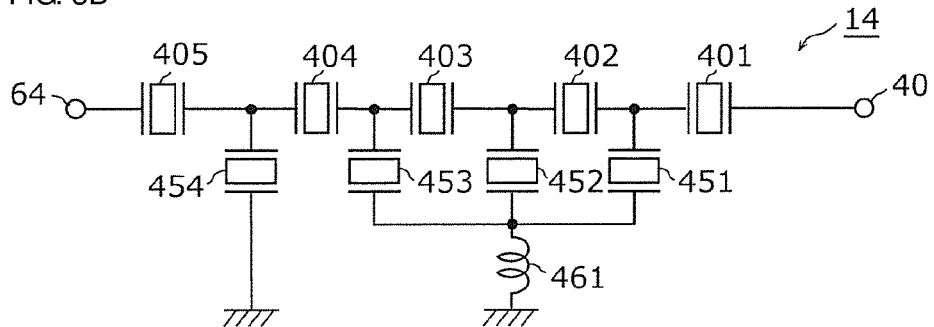
FIG. 3D is a circuit configuration diagram of Band 66 reception-side filter of the multiplexer according to Preferred Embodiment 1 of the present invention.

FIG. 3D is a circuit configuration diagram of the Band 66 reception-side filter 14 of the multiplexer 1 according to the present preferred embodiment. The reception-side filter 14 includes series resonators 401 through 405, parallel resonators 451 through 454, and an inductance element 461 to perform matching.

The series resonators 401 through 405 are connected in series between a reception output terminal 40 and a reception input terminal 64. The parallel resonators 451 through 454 are also connected in parallel between contact points of the reception output terminal 40, the reception input terminal 64, and the series resonators 401 through 405, and reference terminals (ground). The reception-side filter 14 is a ladder bandpass filter due to the above-described configuration of the series resonators 401 through 405 and parallel resonators 451 through 454. The inductance element 461 is also connected between the connection point of the parallel resonators 451, 452, and 453, and the reference terminal.

The reception input terminal 64 is connected to the common terminal 50 (see FIG. 1). The reception input terminal 64 is also connected to the series resonator 405, and is not directly connected to the parallel resonator 454, as illustrated in FIG. 3D.

Note that a LNA (omitted from illustration), for example, is preferably connected to the reception output terminals 20 and 40. The characteristic impedance of the reception output terminals 20 and 40 may differ in accordance with the characteristics of the LNA connected thereto. Further, the characteristic impedance of the reception output terminals 20 and 40 and the transmission input terminals 10 and 30 may each differ from each other.

The layout configuration of the resonators and circuit elements in the surface acoustic wave filters that the multiplexer 1 according to the present preferred embodiment includes is not restricted to the layout configuration exemplarily illustrated by the transmission-side filters 11 and 13 and the reception-side filters 12 and 14 in the present preferred embodiment. The layout configuration of the resonators and circuit elements in the surface acoustic wave filters described above differs depending on the bandpass characteristics of the requested specifications in each frequency band. Examples of the aforementioned layout configuration include the number of series resonators and parallel resonators that are arrayed, and selection of the filter configuration, such as ladder filter, longitudinally coupled resonator, and so forth.

Examples of the characteristics of the principal portions according to a preferred embodiment of the present invention, of the layout configurations of the resonators and circuit elements in the elastic wave filters included in the multiplexer 1 according to the present preferred embodiment preferably are as follows.

(1) The transmission-side filters 11 and 13 and the reception-side filters 12 and 14 each include at least one of the series resonator and parallel resonator.

(2) The reception input terminal 62 of the reception-side filter 12, which is one elastic wave filter, is connected to the common terminal 50 via the inductance element 21, and also is connected to the parallel resonator 251.

(3) The transmission output terminals 61 and 63 of the transmission-side filters 11 and 13 and the reception input terminal 64 of the reception-side filter 14, i.e., of the elastic wave filters excluding the reception-side filter 12, are each connected to the common terminal 50, and of the series resonators and parallel resonators, are connected to the series resonators 105, 304, and 405.

That is to say, the multiplexer 1 according to the present preferred embodiment includes a plurality of elastic wave filters with passbands that are different from each other, the common terminal 50 at which the inductance element 31 is connected between the connection path to the antenna element 2 and the reference terminal and the capacitance element 32 is connected in series to the connection path to the antenna element 2, and the inductance element 21 that is connected in series between the common terminal 50 and the reception input terminal 62 of the reception-side filter 12 that is one elastic wave filter.

Each of the plurality of elastic wave filters includes at least one series resonator including IDT electrodes provided on the piezoelectric substrate 5 (see FIGS. 2A to 2C) and connected between an input terminal and output terminal, and parallel resonator IDT electrodes provided on the piezoelectric substrate and connected between a connection path connecting an input terminal and output terminal, and a reference terminal. The reception input terminal 62 of the reception-side filter 12, of the plurality of elastic wave filters, is connected to the common terminal 50 via the inductance element 21, and is also connected to the parallel resonator 251. On the other hand, the transmission output terminals 61 and 63, and the reception input terminal 64 of the transmission-side filters 11 and 13 and the reception-side filter 14 are each connected to the common terminal 50 and connected to the series resonators 105, 304, and 405, and are not connected to a parallel resonator.

The inductance element 31 is connected between the connection path of the common terminal 50 and antenna element 2, and the reference terminal, and the capacitance element 32 is connected in series to the connection path of the common terminal 50 and antenna element 2. Changing the inductance value of the inductance element 31 and the capacitance value of the capacitance element 32 enables complex impedance of the multiplexer 1 as viewed from the common terminal 50 to be moved in two directions of a capacitance side or an induction side, and an open side or a shorted side.

Now, the operation principle of the ladder surface acoustic wave filter according to the present preferred embodiment will be described.

For example, the parallel resonators 151 through 154 illustrated in FIG. 3A each have a resonant frequency frp and anti-resonant frequency fap (>frp), as resonance characteristics. The series resonators 102 through 105 also each have a resonant frequency frs and anti-resonant frequency fas (>frs>frp), as resonance characteristics. Although the resonant frequencies frs of the series resonators 102 through 105 are preferably designed to be the same or substantially the same, the values do not necessarily need to be the same or substantially the same. This is also true for the anti-resonant frequencies fas of the series resonators 102 through 105, the resonant frequencies frp of the parallel resonators 151 through 154, and the anti-resonant frequencies fap of the parallel resonators 151 through 154, in that the values do not necessarily need to be the same or substantially the same.

When constructing a bandpass filter from a ladder configuration of resonators, the anti-resonant frequency fap of the parallel resonators 151 through 154 and the resonant frequency frs of the series resonators 102 through 105 are preferably brought into close proximity. Thus, around the resonant frequency frp where the impedance of the parallel resonators 151 through 154 approaches 0 becomes a low-frequency side stopband. Accordingly, when the frequency rises, the impedance of the parallel resonators 151 through 154 becomes higher around the anti-resonant frequency fap, and the impedance of the series resonators 102 through 105 around the resonant frequency frs approaches 0. As a result, around the anti-resonant frequency fap to the resonant frequency frs becomes a signal passband on the signal path from the transmission input terminal 10 to the transmission output terminal 61. When the frequency further rises to around the anti-resonant frequency fas, the impedance of the series resonators 102 through 105 becomes higher, thus providing a high-frequency side stopband. That is to say, where the anti-resonant frequency fas of the series resonators 102 through 105 is set outside the passband greatly affects the steepness of attenuation characteristics at the high-frequency side stopband.

When high-frequency signals are received from the transmission input terminal 10 to the transmission-side filter 11, potential differences occur between the transmission input terminal 10 and the reference terminal, which causes the piezoelectric substrate 5 to warp, which generates surface acoustic waves propagating in the X direction. Only high-frequency signals having the frequency component regarding which passing is desired pass through the transmission-side filter 11, due to the pitch λ of the IDT electrodes 101a and 101b and the wavelength of the passband generally corresponding to one another.

High-frequency bandpass characteristics and impedance characteristics of the multiplexer 1 according to the present preferred embodiment will be described, making comparison with a multiplexer according to a comparative example.

High-frequency bandpass characteristics of the multiplexer 1 according to the present preferred embodiment will be described, comparing them with high-frequency bandpass characteristics of a multiplexer according to a comparative example.

In comparison with the multiplexer 1 according to the present preferred embodiment illustrated in FIG. 1, the multiplexer according to the comparative example is configured with no inductance element 31 connected between the connection path of the common terminal 50 and antenna element 2 and the ground which is the reference terminal, and no capacitance element 32 provided in series at this connection path. The multiplexer according to the comparative example has a configuration in which an inductance element is connected in series between the common terminal 50 and the antenna element 2.

Figure 5A:
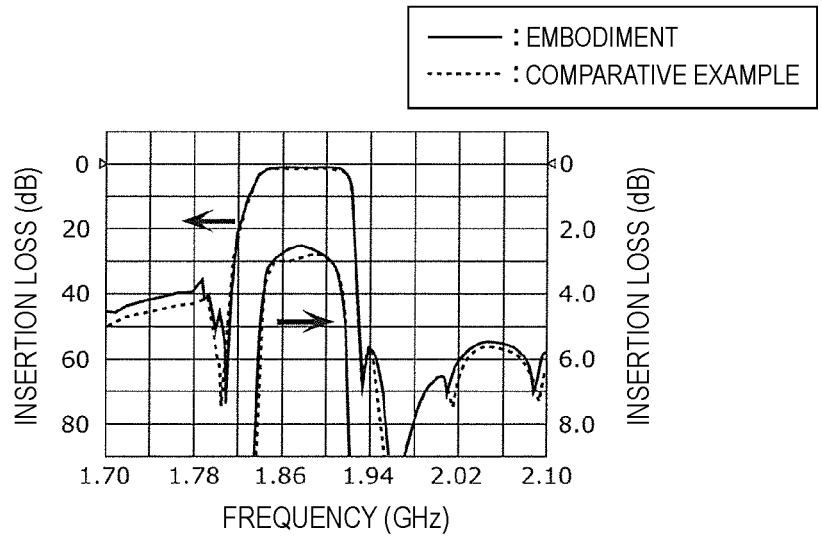
FIG. 5A is a graph comparing transmission characteristics of Band 25 transmission-side filter according to Preferred Embodiment 1 of the present invention and a comparative example.
Figure 5B:
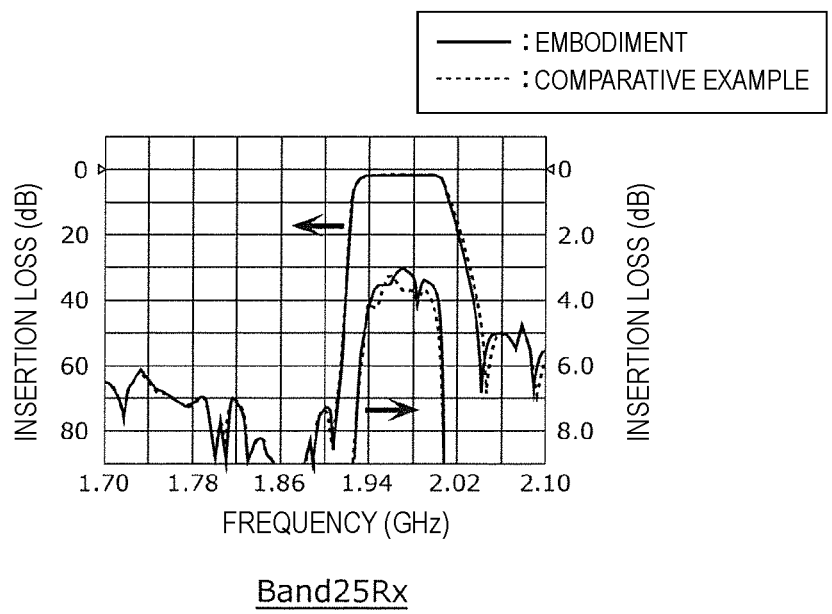
FIG. 5B is a graph comparing transmission characteristics of Band 25 reception-side filter according to Preferred Embodiment 1 of the present invention and a comparative example.
Figure 5C:
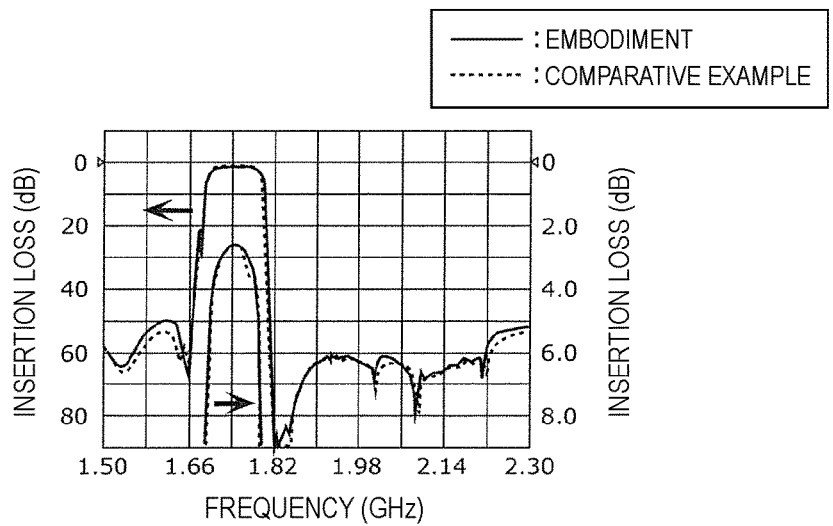
FIG. 5C is a graph comparing transmission characteristics of Band 66 transmission-side filter according to Preferred Embodiment 1 of the present invention and a comparative example.
Figure 5D:
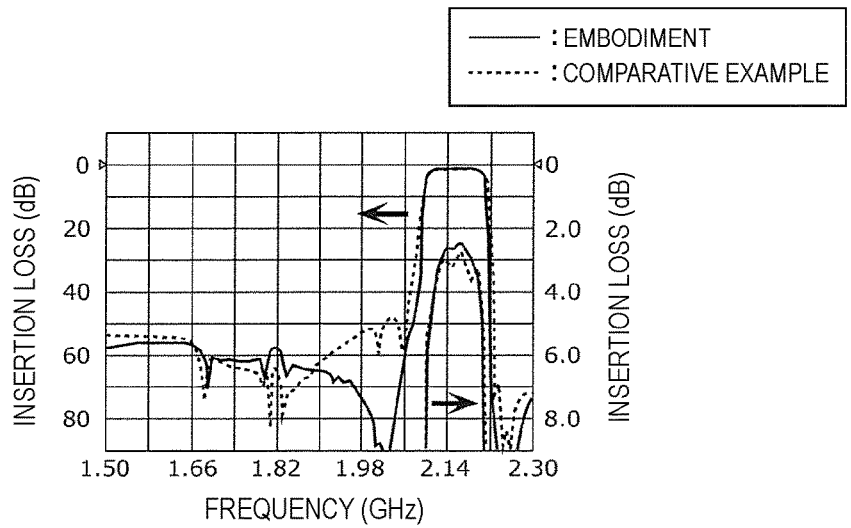
FIG. 5D is a graph comparing transmission characteristics of Band 66 reception-side filter according to Preferred Embodiment 1 of the present invention and a comparative example.

FIG. 5A is a graph comparing Band 25 transmission characteristics of the transmission-side filter 11 according to the present preferred embodiment and the comparative example. FIG. 5B is a graph comparing Band 25 transmission characteristics of the reception-side filter 12 according to the present preferred embodiment and the comparative example. FIG. 5C is a graph comparing Band 66 transmission characteristics of the transmission-side filter 13 according to the present preferred embodiment and the comparative example. FIG. 5D is a graph comparing Band 66 transmission characteristics of the reception-side filter 14 according to the present preferred embodiment and the comparative example.

It can be seen from FIGS. 5A through 5D that the insertion loss within the passband of the multiplexer 1 according to the present preferred embodiment is better than the insertion loss within the passband of the multiplexer according to the comparative example at the transmission side and the reception side for Band 25 and at the transmission side and the reception side for Band 66. It can further be seen that the multiplexer 1 according to the present preferred embodiment satisfies the requested specifications within the passband (for example, transmission-side insertion loss of about 2.0 dB or less and reception-side insertion loss of about 3.0 dB or less) at all frequency bands at the transmission side and the reception side for Band 25 and at the reception side for Band 66.

It can also be seen that the multiplexer according to the comparative example does not satisfy the requested specifications within the passband at the transmission side and the reception side for Band 25.

Thus, according to the multiplexer 1 of the present preferred embodiment, even if the number of bands and the number of modes to be handled are increased, insertion loss within the passband of each filter is able to be reduced.

Impedance matching at the multiplexer 1 will be described below, including the reason why the multiplexer 1 according to the present preferred embodiment is able to provide low loss within the passband.

Figure 6A:
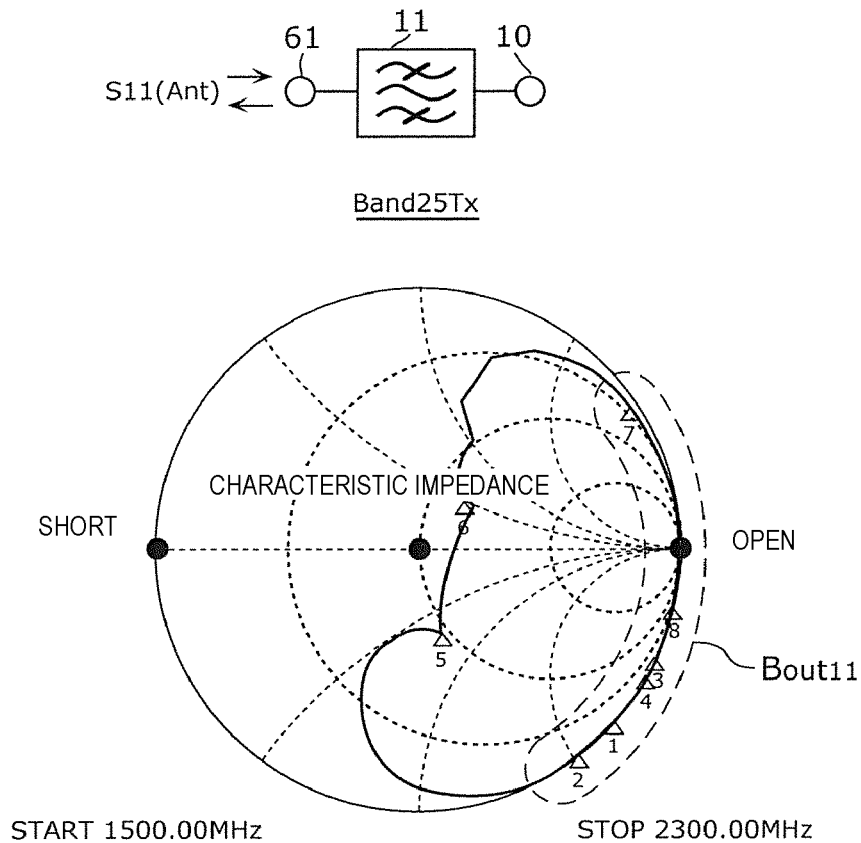
FIG. 6A is a Smith chart representing complex impedance as viewed from the transmission output terminal of a Band 25 transmission-side filter alone according to Preferred Embodiment 1 of the present invention.
Figure 6B:
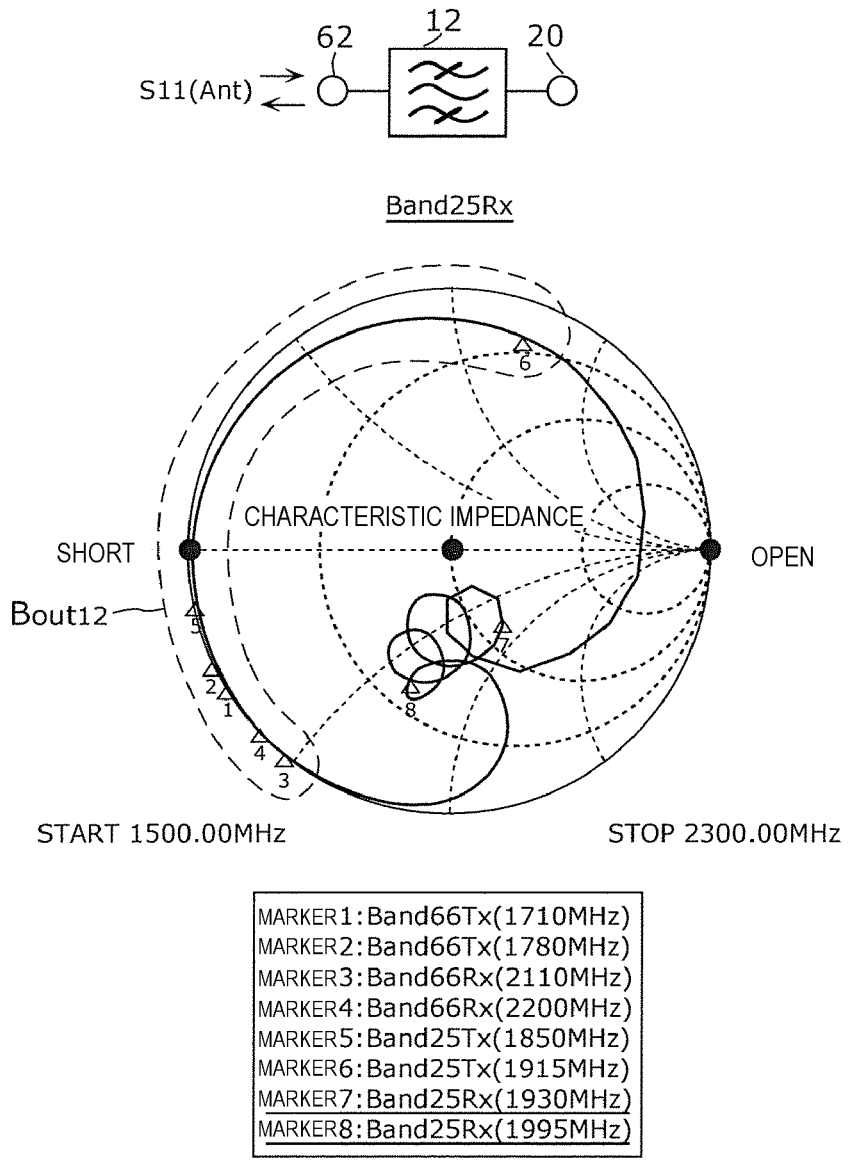
FIG. 6B is a Smith chart representing complex impedance as viewed from the reception input terminal of a Band 25 reception-side filter alone according to Preferred Embodiment 1 of the present invention.

FIGS. 6A and 6B are Smith charts representing complex impedance as viewed from the transmission output terminal 61 of a Band 25 transmission-side filter 11 alone and complex impedance as viewed from the reception input terminal 62 of a Band 25 reception-side filter 12 alone according to the present preferred embodiment. FIGS. 6C and 6D are Smith charts representing complex impedance as viewed from the transmission output terminal 63 of a Band 66 transmission-side filter 13 alone and complex impedance as viewed from the reception input terminal 64 of a Band 66 reception-side filter 14 alone according to the present preferred embodiment.

With regard to the impedances of the transmission-side filters 11 and 13 and the reception-side filter 14 alone, the complex impedance at frequency bands outside of the passband is designed to be at the open side in the multiplexer 1 according to the present preferred embodiment. Specifically, the complex impedances of out-of-passband region $B_{OUT11}$ of the transmission-side filter 11 to which the inductance element 21 is not connected in FIG. 6A, out-of-passband region $B_{OUT13}$ of the transmission-side filter 13 to which the inductance element 21 is not connected in FIG. 6C, and out-of-passband region $B_{OUT14}$ of the reception-side filter 14 to which the inductance element 21 is not connected in FIG. 6D, are located at the open side. The resonators connected to the common terminal 50 in the above three filters are series resonators and not parallel resonators, in order to provide these complex impedance layouts.

On the other hand, the resonator connected to the common terminal 50 in the reception-side filter 12 to which the inductance element 21 is connected, is a parallel resonator. Accordingly, the complex impedance of the out-of-passband region $B_{OUT12}$ of the reception-side filter 12 is located at the short side, as illustrated in FIG. 6B. The reason why the out-of-passband region $B_{OUT12}$ is located at the short side will be described later.

Figure 7:
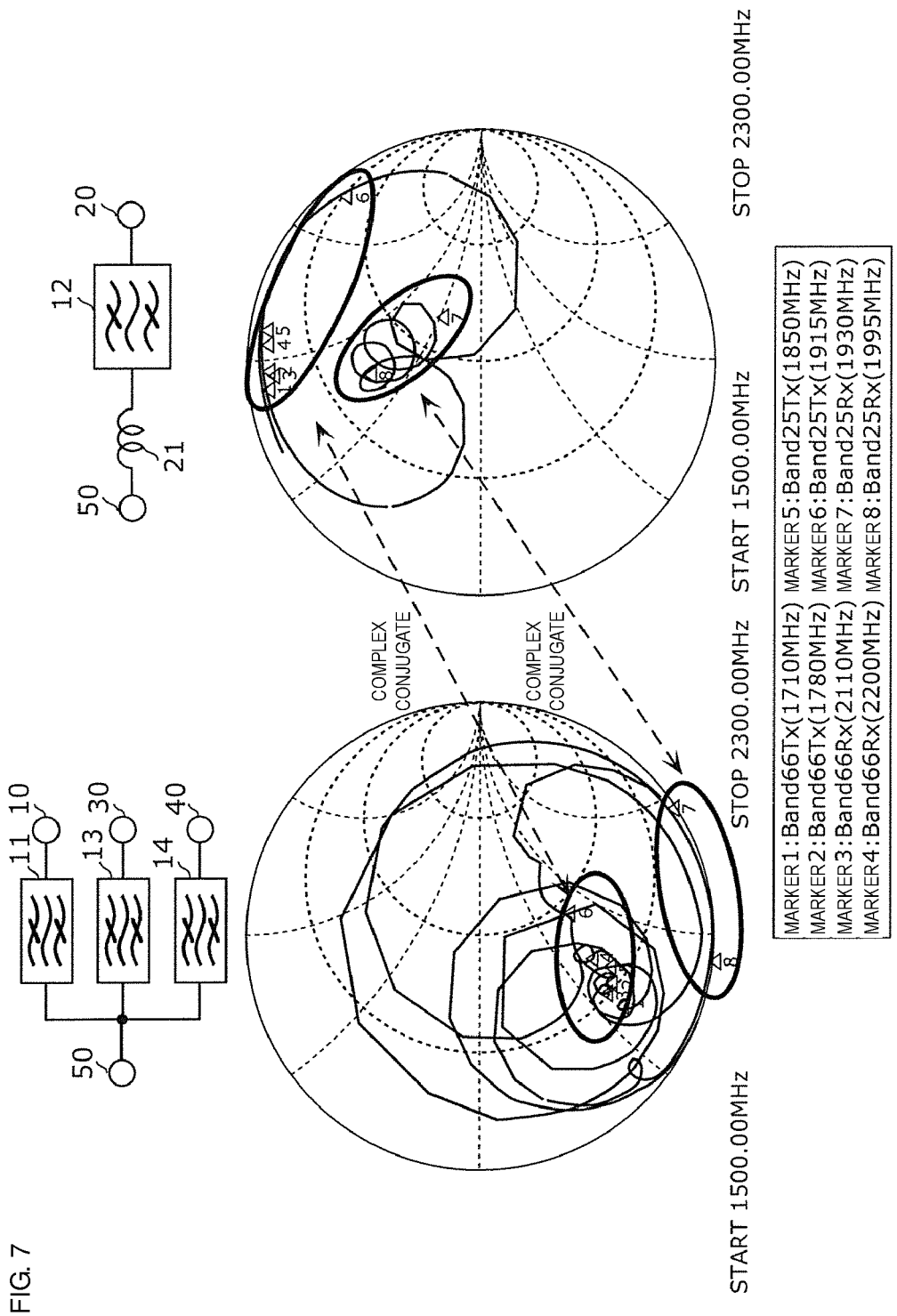
FIG. 7 is a Smith chart representing complex impedance as viewed from a common terminal of a circuit alone in which all filters other than the Band 25 reception-side filter according to Preferred Embodiment 1 of the present invention are connected in parallel at the common terminal, and a Smith chart representing complex impedance as viewed from an inductance element side of a circuit alone in which the Band 25 reception-side filter according to Preferred Embodiment 1 of the present invention and the inductance element are connected in series.

FIG. 7 is a Smith chart representing complex impedance of a circuit alone where all filters other than the Band 25 reception-side filter 12 according to the present preferred embodiment are connected in parallel at the common terminal 50, as viewed from the common terminal 50 (left side), and a Smith chart representing complex impedance of a circuit alone where the Band 25 reception-side filter 12 according to the present preferred embodiment and the inductance element 21 have been connected in series as viewed from the common terminal 50 (right side).

It can be seen from FIG. 7 that complex impedance in a predetermined passband, in a state in which the inductance element and the input terminal of the reception-side filter 12 are connected in series, when viewing the reception-side filter 12 alone via the inductance element 21, and complex impedance at the predetermined passband, in a state in which, of the input terminals and output terminals of the transmission-side filters 11 and 13 and reception-side filter 14, the closer terminal to the antenna element 2 is connected to the common terminal 50, when viewing the transmission-side filters 11 and 13 and the reception-side filter 14 from the side of the terminal connected to the common terminal 50, are substantially in a complex conjugate relationship. That is to say, compositing the two complex impedances achieves impedance matching, and the complex impedance of the composited circuits is close to the characteristic impedance.

Note that the expression that the complex impedances of two circuits are in a complex conjugate relationship includes a relationship in which the positive and negative complex components of each of the complex impedances are reversed, and is not restricted to a case in which the absolute values of the complex components are equal or substantially equal. That is to say, the complex conjugate relationship in the present preferred embodiment also includes cases in which the complex impedance of one of the circuits is located at a capacitive area (the lower semicircle of the Smith chart) and the complex impedance of the other circuit is located at an inductive area (the upper semicircle of the Smith chart).

Now, the reason why the complex impedance of the out-of-passband region $B_{OUT12}$ of the reception-side filter 12 is located at the short side is to shift the complex impedance of the out-of-passband region $B_{OUT12}$ (the passband of the transmission-side filters 11, the transmission-side filter 13, and the reception-side filter 14) to a position having the above-described complex conjugate relationship by the inductance element 21, as illustrated in FIG. 6B. The inductance value of the inductance element 21 at this time is preferably, for example, about 5.9 nH.

In a case in which the out-of-passband region $B_{OUT12}$ of the reception-side filter 12 is situated at the open side, the out-of-passband region $B_{OUT12}$ must be shifted to a position at which there is the above-described complex conjugate relationship by an inductance element 21 that has a greater inductance value. The inductance element 21 is connected in series to the reception-side filter 12, such that the greater the inductance value is, the poorer the insertion loss in the passband of the reception-side filter 12 becomes. Accordingly, the inductance value of the inductance element 21 is able to be maintained small by locating the complex impedance of the out-of-passband region $B_{OUT12}$ at the short side using the parallel resonator 251, as with the reception-side filter 12 according to the present preferred embodiment, thus enabling insertion loss in the passband to be reduced.

Figure 8A:
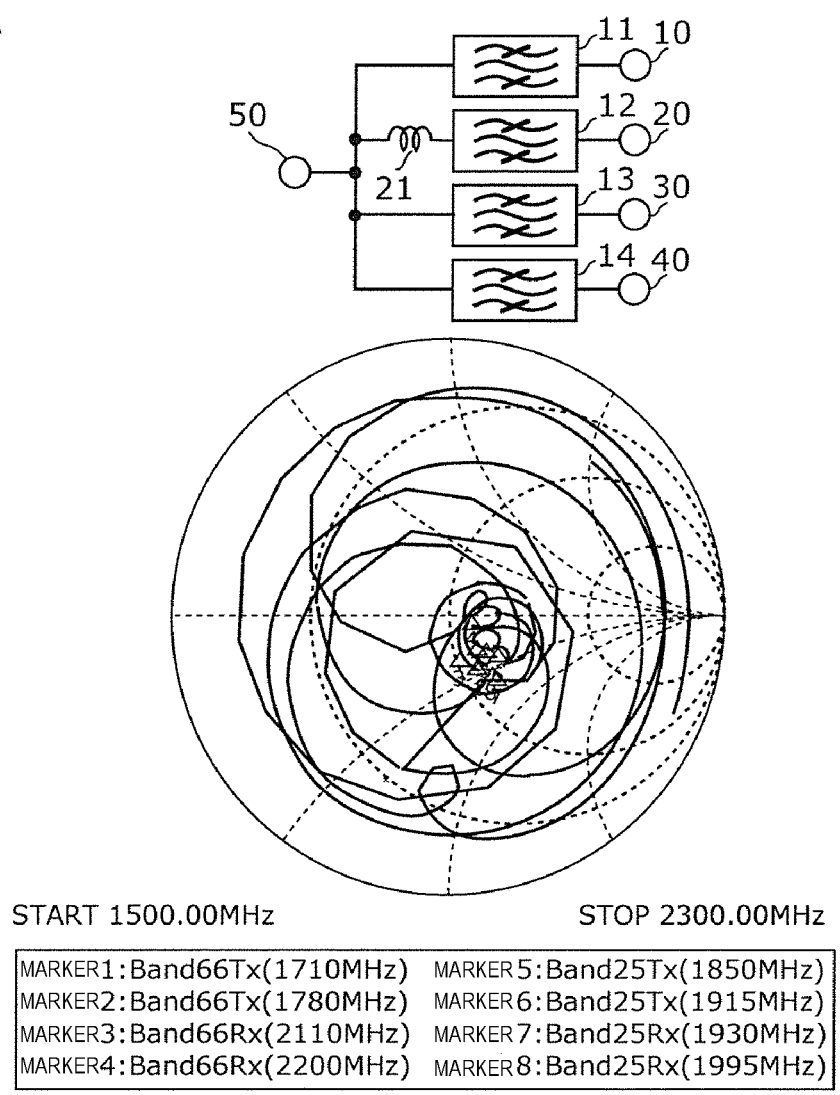
FIG. 8A is a Smith chart illustrating complex impedance as viewed from the common terminal of a circuit in which four filters according to Preferred Embodiment 1 of the present invention are connected in parallel at the common terminal.

FIG. 8A is a Smith chart representing complex impedance, viewing the multiplexer 1 according to the present preferred embodiment from the common terminal 50. That is to say, the complex impedance illustrated in FIG. 8A represents the complex impedances of the two circuits illustrated in FIG. 7 composited, as viewed from the common terminal 50 thereof. The complex impedances of the two circuits illustrated in FIG. 7 are located so as to be in a mutually complex conjugate relationship wherein the composited complex impedance of the composited circuits is close to the characteristic impedance in the four passbands, thus achieving impedance matching.

Figure 8B:
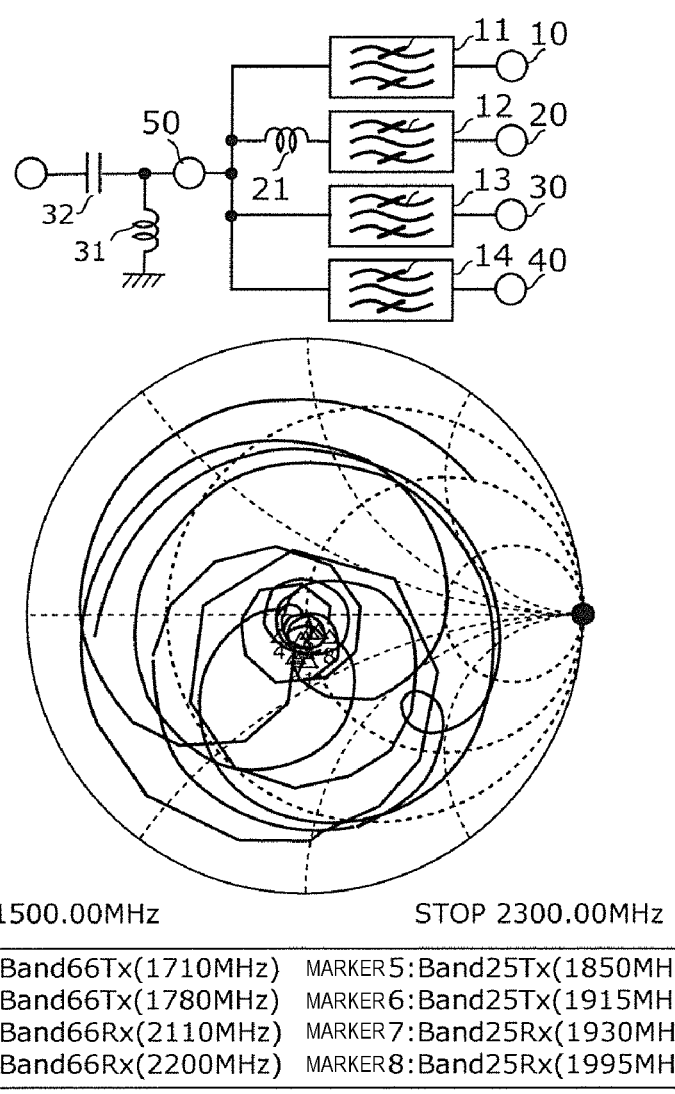
FIG. 8B is a Smith chart illustrating complex impedance where four filters according to Preferred Embodiment 1 of the present invention are connected in parallel at the common terminal, and an inductance element is connected between a connection path of the antenna and the common terminal, and a reference terminal.

FIG. 8B is a Smith chart representing complex impedance, viewing from the antenna element 2 side, in an arrangement in which the inductance element 31 is connected between the connection path of the common terminal 50 and antenna element 2 and the reference terminal, and the capacitance element 32 is connected in series at the connection path of the common terminal 50 and antenna element 2. The circuit in which two circuits, located in a mutually complex conjugate relationship, have been composited, exhibits complex impedance that is shifted towards the capacitive side and the open side from the characteristic impedance, as illustrated in FIG. 8A.

On the other hand, by connecting the inductance element 31 between the connection path of the common terminal 50 and the antenna element 2 and the reference terminal, and connecting the capacitance element 32 in series at the connection path of the common terminal 50 and the antenna element 2, adjusts the complex impedance of the multiplexer 1 as viewed from the common terminal 50 to the inductive side and the short side. Note that, preferably, the inductance value of the inductance element 31 at this time is about 7.0 nH and the capacitance value of the capacitance element 32 is about 2.5 pF, for example.

Accordingly, in the transmission-side filters 11 and 13 and the reception-side filters 12 and 14, the characteristic impedance at the input terminal or output terminal opposite to the input terminal or output terminal closer to the antenna element 2 is able to be adjusted in accordance with a PA or LNA connected thereto. Thus, impedance matching at the antenna terminal is able to be easily achieved without complicating the design of the transmission-side filters 11 and 13 and the reception-side filters 12 and 14.

The following are features of the multiplexer 1 according to the present preferred embodiment.

(1) The inductance element 21 is connected in series between the reception-side filter 12 and the common terminal 50.

(2) The inductance element 31 is connected between the connection path of the common terminal 50 and the antenna element 2 and the reference terminal, and the capacitance element 32 is connected in series to the connection path of the common terminal 50 and the antenna element 2.

(3) The parallel resonator 251 is connected to the reception input terminal 62 of the reception-side filter 12.

(4) The transmission output terminal 61 of the transmission-side filter 11, the transmission output terminal 63 of the transmission-side filter 13, and the reception input terminal 64 of the reception-side filter 14, are each connected to the series resonators 105, 304, and 405.

According to this configuration, the complex impedance of the circuit alone in which the inductance element 21 and the reception-side filter 12 are connected in series as viewed from the common terminal 50, and the complex impedance of the circuit alone in which all filters other than the reception-side filter 12 are connected in parallel at the common terminal 50, are able to be in a complex conjugate relationship. Accordingly, impedance matching with the characteristic impedance is easily achieved for the complex impedance of the multiplexer 1 including the circuit in which the two above-described circuits have been composited as viewed from the common terminal 50, while providing low loss in the passband. Also, by connecting the inductance element 31 between the connection path of the common terminal 50 and the antenna element 2 and the reference terminal, and connecting the capacitance element 32 in series to the connection path of the common terminal 50 and the antenna element 2, the complex impedance of the multiplexer 1 as viewed from the common terminal 50 is able to be moved in two directions on the Smith chart. For example, the complex impedance of the multiplexer 1 as viewed from the common terminal 50 is able to be adjusted to the inductive side and the short side. Accordingly, impedance matching at the antenna terminal is able to be easily achieved without complicating the design of the transmission-side filters 11 and 13 and the reception-side filters 12 and 14.

Note that in the present preferred embodiment, a configuration has been illustrated and described in which, preferably, the inductance element 31 is connected between the connection path of the common terminal 50 and the antenna element 2 and the reference terminal, and the capacitance element 32 is connected in series to the connection path of the common terminal 50 and the antenna element 2, but any combination of inductance element and capacitance element may be used for the circuit element connected between the connection path of the common terminal 50 and the antenna element 2 and the reference terminal, and the circuit element connected in series to the connection path of the common terminal 50 and the antenna element 2. It is sufficient for at least one each to be provided of the circuit element connected between the connection path of the common terminal 50 and antenna element 2 and the reference terminal, and the circuit element connected in series to the connection path of the common terminal 50 and the antenna element 2, and two or more may be provided.

Preferred Embodiment 2

The multiplexer 1 according to Preferred Embodiment 2 of the present invention differs from the multiplexer 1 shown in Preferred Embodiment 1 in that the types and connection positions of circuit elements connected between the common terminal 50 and the antenna element 2 differ.

Figure 9:
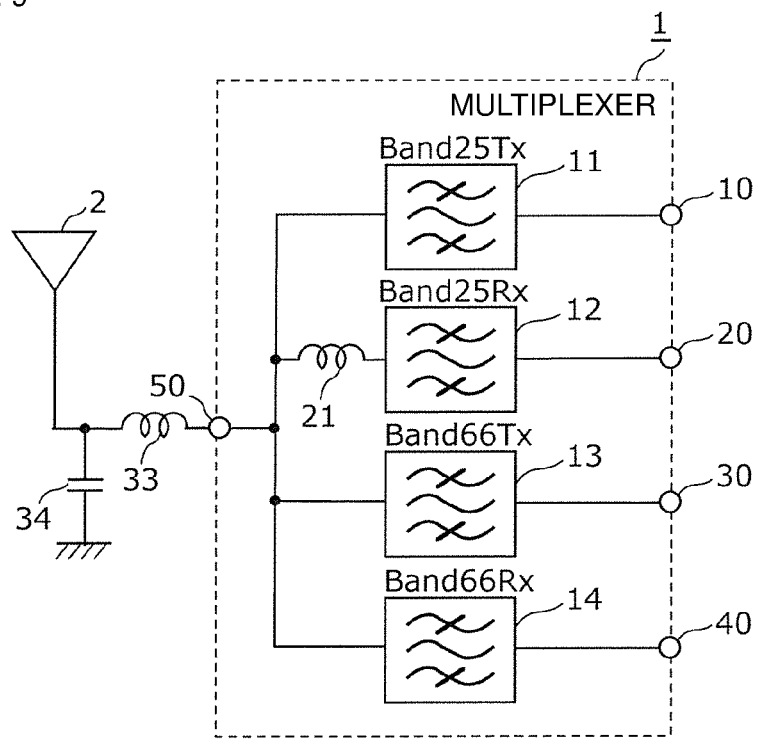
FIG. 9 is a circuit configuration diagram illustrating an example of a multiplexer according to Preferred Embodiment 2 of the present invention.

FIG. 9 is a circuit configuration diagram illustrating an example of the multiplexer 1 according to the present preferred embodiment. The multiplexer 1 illustrated in FIG. 9 includes an inductance element 33 connected in series between the common terminal 50 and the antenna element 2, and a capacitance element 34 connected between the connection path of the common terminal 50 and the antenna element 2 and the reference terminal. The inductance element 33 is connected closer to the common terminal 50 side than the capacitance element 34.

Figure 10:
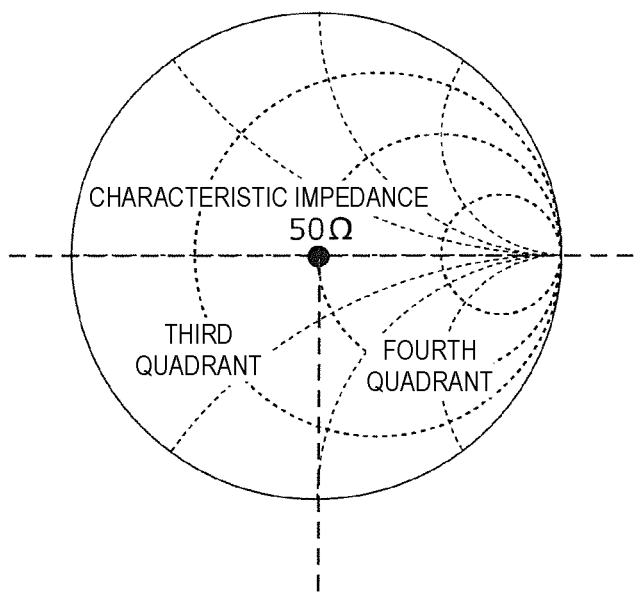
FIG. 10 is a diagram for describing the relationship between complex impedance as viewed from a common terminal and types and connection positions of circuit elements connected between the common terminal and antenna element in the multiplexer according to Preferred Embodiment 2 of the present invention.

Now, an optimal combination of types of circuit elements connected between the common terminal 50 and the antenna element 2 and connection positions thereof will be described. FIG. 10 is a diagram for describing the relationship between complex impedance as viewed from the common terminal 50 in the multiplexer according to the present preferred embodiment, and types of circuit elements connected between the common terminal 50 and the antenna element 2 and the connection positions thereof. FIGS. 11A through 11D are diagrams illustrating examples of types of circuit elements connected between the common terminal and the antenna element, and the connection positions thereof, in the present preferred embodiment. Note that the connection terminal of the antenna element 2 is represented by terminal 2a in FIGS. 11A through 11D.

The optimal combination of types of circuit elements connected between the common terminal 50 and the terminal 2a of the antenna element 2 and the connection positions thereof depends on the value of the real part of the characteristic impedance of the multiplexer 1 as viewed from the common terminal 50, and in which quadrant on the Smith chart the characteristic impedance of the high-frequency passband of the multiplexer 1 is located.

Figure 11A:
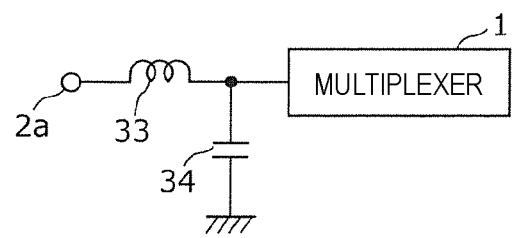
FIG. 11A is a diagram illustrating an example of a type and connection position of a circuit element connected between the common terminal and antenna element in the multiplexer according to Preferred Embodiment 2 of the present invention.

In a case in which the real part of the characteristic impedance of the multiplexer 1 is about 50Ω or higher, the combination of the inductance element 33 and capacitance element illustrated in FIG. 11A is effective if the characteristic impedance in the passband of the multiplexer 1 is in either the third quadrant or the fourth quadrant of the Smith chart illustrated in FIG. 10. In this configuration, preferably, the inductance element 33 is connected in series to the connection path of the common terminal 50 (see FIG. 9) of the multiplexer 1 and the terminal 2a, and the capacitance element 34 is connected between the connection path of the inductance element 33 and the common terminal 50, and the reference terminal, as illustrated in FIG. 11A.

According to this configuration, the complex impedance as viewed from the common terminal is able to be matched to the characteristic impedance while providing low loss in the passband. In a case in which the real part of the characteristic impedance of the multiplexer 1 is lower than about 50Ω, the combination of the inductance element 33 and the capacitance element 34 illustrated in FIG. 11B is effective if the characteristic impedance in the high-frequency passband of the multiplexer 1 is in the third quadrant of the Smith chart illustrated in FIG. 10.

Figure 11B:
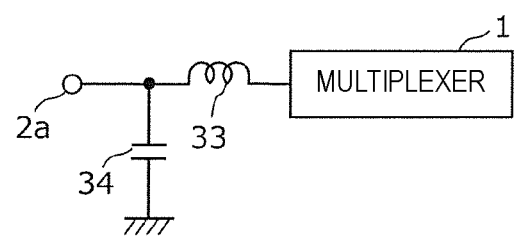
FIG. 11B is a diagram illustrating another example of a type and connection position of a circuit element connected between the common terminal and antenna element in the multiplexer according to Preferred Embodiment 2 of the present invention.

In this configuration, preferably, the inductance element 33 is connected in series to the connection path of the common terminal 50 (see FIG. 9) of the multiplexer 1 and the terminal 2a, and the capacitance element 34 is connected between the connection path of the terminal 2a and the inductance element 33, and the reference terminal, as illustrated in FIG. 11B. This configuration is the same as the combination of circuit elements illustrated in FIG. 9.

Accordingly, the combination and connection positions of the inductance element 33 and the capacitance element 34 illustrated in FIG. 9 are effective if the real part of the characteristic impedance of the multiplexer 1 is lower than about 50Ω as viewed from the common terminal 50 side of the multiplexer 1, and the characteristic impedance in the passband of the multiplexer 1 is in the third quadrant of the Smith chart.

Figure 11C:
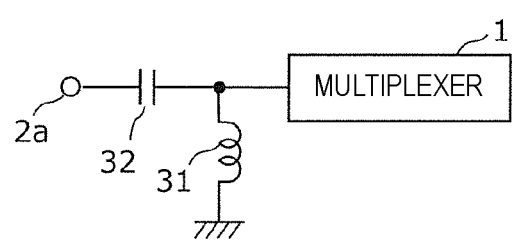
FIG. 11C is a diagram illustrating another example of a type and connection position of a circuit element connected between the common terminal and antenna element in the multiplexer according to Preferred Embodiment 2 of the present invention.
Figure 11D:
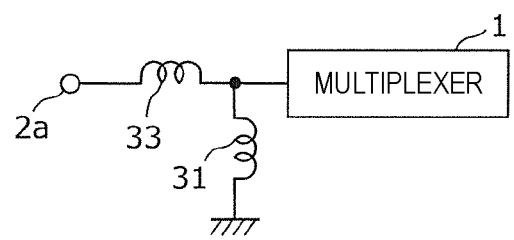
FIG. 11D is a diagram illustrating another example of a type and connection position of a circuit element connected between the common terminal and antenna element in the multiplexer according to Preferred Embodiment 2 of the present invention.

In a case in which the real part of the characteristic impedance of the multiplexer 1 is lower than about 50Ω, and the characteristic impedance in the high-frequency passband of the multiplexer 1 is in the fourth quadrant of the Smith chart illustrated in FIG. 10, the combination of the inductance element 31 and the capacitance element 32 illustrated in FIG. 11C, and the combination of the inductance element 31 and the inductance element 33 illustrated in FIG. 11D, are effective.

In this configuration, the capacitance element 32 is connected in series to the connection path of the common terminal (see FIG. 9) of the multiplexer 1 and the terminal 2a, and the inductance element 31 is connected between the connection path of the common terminal 50 and the capacitance element 32 and the reference terminal, as illustrated in FIG. 11C. This configuration is the same or substantially the same as the combination of the inductance element 31 and capacitance element 32 illustrated in FIG. 1. Accordingly, the combination and the connection point of the inductance element 31 and the capacitance element 32 illustrated in FIG. 1 is effective if the real part of the characteristic impedance of the multiplexer 1 as viewed from the common terminal 50 side is lower than about 50Ω, and the characteristic impedance in the passband of the multiplexer 1 is in the fourth quadrant of the Smith chart.

A configuration may also be provided in which the inductance element 33 is connected in series to the connection path of the common terminal 50 (see FIG. 9) of the multiplexer 1 and the terminal 2a, and the inductance element 31 is connected between the connection path of the common terminal 50 and the inductance element 33 and the reference terminal, as illustrated in FIG. 11D. This configuration is also effective if the real part of the characteristic impedance of the multiplexer 1 as viewed from the common terminal 50 side is lower than about 50Ω, and the characteristic impedance in the passband of the multiplexer 1 is in the fourth quadrant of the Smith chart.

Figure 12:
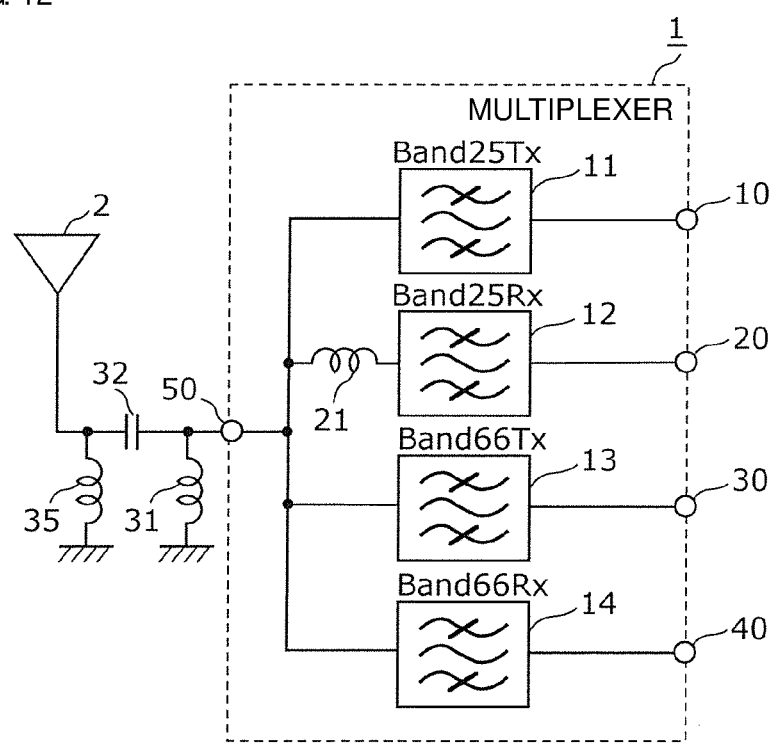
FIG. 12 is a circuit configuration diagram illustrating another example of a multiplexer according to Preferred Embodiment 2 of the present invention.

Note that the number of the circuit element connected between the connection path of the common terminal 50 and the antenna element 2 and the reference terminal, and the circuit element connected in series to the connection path of the common terminal 50 and the antenna element 2, is not restricted to one each, and two or more may be provided. FIG. 12 is a circuit diagram illustrating another example of a multiplexer according to the present preferred embodiment.

The multiplexer 1 illustrated in FIG. 12 includes the capacitance element 32 connected in series to the connection path of the common terminal 50 and the antenna element 2. The inductance element 31 also is provided between the connection path of the common terminal 50 and the capacitance element 32 and the reference terminal. Further, the multiplexer 1 illustrated in FIG. 12 includes an inductance element 35 provided between the connection path of the capacitance element 32 and the antenna element 2 and the reference terminal.

According to this configuration, two inductance elements 31 and 35 are preferably provided between the connection path of the common terminal 50 and the antenna element 2 and the reference terminal, such that even finer adjustment is able to be made. Accordingly, the characteristic impedance is able to be easily adjusted to the inductive side and the short side on the Smith chart to match impedance.

Although examples of quadplexers have been described regarding the multiplexers according to preferred embodiments of the present invention, the present invention is not restricted to the above-described arrangements. For example, arrangements in which the above-described preferred embodiments are modified as follows may be included in the present invention.

For example, the piezoelectric film 53 of the piezoelectric substrate 5 according to a preferred embodiment of the present invention is preferably made of a 50° Y-cut X-propagation LiTaO$_3$ monocrystal, but the cut angle of the monocrystal material is not restricted to this value. That is to say, the cut angle of the piezoelectric substrate of the surface acoustic wave filters defining the multiplexer according to the preferred embodiments is not restricted to about 50° Y. The same or substantially the same effects and advantages are obtained by surface acoustic wave filters made of a LiTaO$_3$ piezoelectric substrate having a cut angle other than that described above.

Also, the multiplexer 1 according to a preferred embodiment of the present invention may further include a configuration in which at least one first circuit element is connected between the connection path of the antenna element 2 and the common terminal 50 and the reference terminal, and at least one second circuit element is connected in series to the connection path of the antenna element 2 and the common terminal 50. The first circuit element and the second circuit element may each be an inductance element or a capacitance element. For example, the multiplexer 1 according to the present preferred embodiment may preferably include a plurality of elastic wave filters having the above-described characteristics, a chip-shaped first inductance element, and the first circuit element and the second circuit element, mounted on a high-frequency substrate.

The inductance element may be a chip inductor, for example, or may be defined by a conductor pattern on the high-frequency substrate. The capacitance element may be a chip capacitor, for example, or may be defined by a conductor pattern on the high-frequency substrate.

The multiplexer according to the present preferred embodiment is not restricted to a Band 25+Band 66 quadplexer as in the preferred embodiments.

Figure 13A:
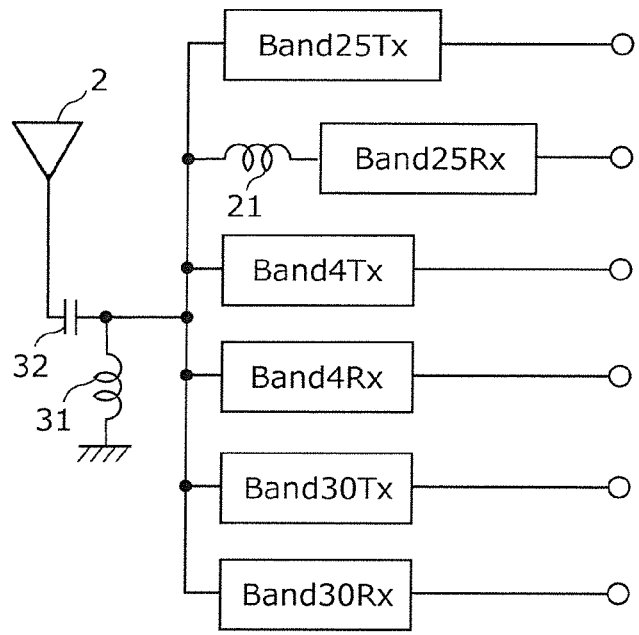
FIG. 13A is a diagram illustrating the configuration of a multiplexer according to Modification 1 of a preferred embodiment of the present invention.

FIG. 13A is a diagram illustrating the configuration of the multiplexer according to Modification 1 of a preferred embodiment of the present invention. For example, the multiplexer according to a preferred embodiment of the present invention may be a hexaplexer including six frequency bands, applied to a system configuration in which Band 25, Band 4, and Band 30 including transmission band and reception band are combined, as illustrated in FIG. 13A. In this case, for example, the inductance element 21 is connected in series to the Band 25 reception-side filter, and a parallel resonator is connected to the reception input terminal of the Band 25 reception-side filter. Further, series resonators are connected to the terminals of the remaining five filters other than the Band 25 reception-side filter, and no parallel resonators are connected thereto. Also, the capacitance element 32 is connected in series to the connection path of the common terminal and the antenna element 2, and the inductance element 31 is connected between the connection path of the common terminal and the capacitance element 32 and the reference terminal.

Figure 13B:
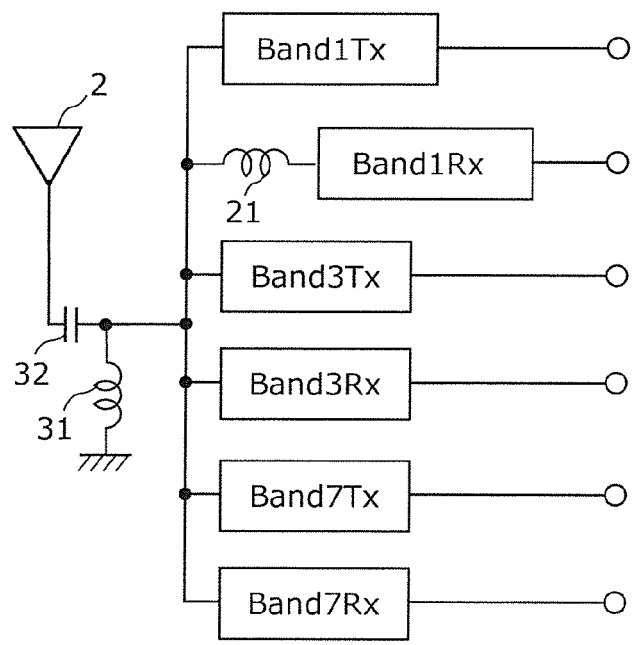
FIG. 13B is a diagram illustrating the configuration of a multiplexer according to Modification 2 of a preferred embodiment of the present invention.

FIG. 13B is a diagram illustrating the configuration of the multiplexer according to Modification 2 of a preferred embodiment of the present invention. For example, the multiplexer according to a preferred embodiment of the present invention may preferably be a hexaplexer including six frequency bands, applied to a system configuration in which Band 1, Band 3, and Band 7 having transmission band and reception band are combined, as illustrated in FIG. 13B. In this case, for example, the inductance element 21 is connected in series to the Band 1 reception-side filter, and a parallel resonator is connected to the reception input terminal of the Band 1 reception-side filter. Further, series resonators are connected to the terminals of the remaining five filters other than the Band 1 reception-side filter, and no parallel resonators are connected thereto. Also, the capacitance element 32 is connected in series to the connection path of the common terminal and the antenna element 2, and the inductance element 31 is connected between the connection path of the common terminal and the capacitance element 32 and the reference terminal.

As described above, sufficient impedance matching is able to be achieved for each of the terminals of multiplexers according to preferred embodiments of the present invention, even when the characteristic impedance differs between the transmission terminal or the reception terminal of the surface acoustic wave filter side and the antenna element side. Accordingly, insertion loss in the passband is able to be reduced even if the number of elastic wave filters is large.

Further, multiplexers according to preferred embodiments of the present invention do not need to be configured including a plurality of duplexers that transmit and receive. For example, multiplexers according to preferred embodiments of the present invention may be applied to a transmission device including a plurality of transmission frequency bands. That is to say, multiplexers according to preferred embodiments of the present invention may be applied to a transmission device that receives a plurality of high-frequency signals including carrier frequency bands that are different from each other, filters the plurality of high-frequency signals, and wirelessly transmits from a common antenna element. The transmission device may include a plurality of transmitting elastic wave filters that receive the plurality of high-frequency signals from a transmission circuit, and pass only a predetermined frequency band, and a common terminal, regarding which at least one first circuit element is connected between a connection path of the common terminal and the antenna element, and a reference terminal, and at least one second circuit element is connected in series to the connection path of the common terminal and the antenna element. Each of the plurality of transmitting elastic wave filters preferably includes at least one of a series resonator including an IDT electrode provided on a piezoelectric substrate and connected between an input terminal and an output terminal, and a parallel resonator including an IDT electrode provided on a piezoelectric substrate and connected between a connection path connecting the input terminal and the output terminal, and a reference terminal. An output terminal of one transmitting elastic wave filter of the plurality of transmitting elastic wave filters is connected to the common terminal via an inductance element that is connected to this output terminal and to the common terminal, and also is connected to the parallel resonator. On the other hand, an output terminal of the transmitting elastic wave filters other than the one transmitting elastic wave filter, is connected to the common terminal, and also is connected to, of the series resonator and the parallel resonator, the series resonator. The first circuit element and the second circuit element may be an inductance element or may be a capacitance element.

Further, multiplexers according to preferred embodiments of the present invention may be applied to a reception device including a plurality of reception frequency bands. That is to say, multiplexers according to preferred embodiments of the present invention may be applied to a reception device that receives a plurality of high-frequency signals including carrier frequency bands that are different from each other via an antenna element, branches the plurality of high-frequency signals, and outputs to a reception circuit. The reception device preferably includes a plurality of receiving elastic wave filters that receive the plurality of high-frequency signals from the antenna element, and pass only a predetermined frequency band, and a common terminal, regarding which at least one first circuit element is connected between a connection path of the common terminal and the antenna element, and a reference terminal, and at least one second circuit element is connected in series to the connection path of the common terminal and the antenna element. Each of the plurality of transmitting elastic wave filters includes at least one of a series resonator including an IDT electrode provided on a piezoelectric substrate and connected between an input terminal and an output terminal, and a parallel resonator including an IDT electrode provided on a piezoelectric substrate and connected between a connection path connecting the input terminal and output terminal, and a reference terminal. An input terminal of one receiving elastic wave filter of the plurality of receiving elastic wave filters is connected to the common terminal via an inductance element that is connected to this input terminal and to the common terminal, and also is connected to the parallel resonator. On the other hand, an input terminal of the receiving elastic wave filters other than the one receiving elastic wave filter, is connected to the common terminal, and also is connected to, of the series resonator and the parallel resonator, the series resonator. The first circuit element and second circuit element may be an inductance element or may be a capacitance element.

A transmission device or a reception device having the configuration described above is able to obtain the same or substantially the same advantages as the multiplexer 1 according to the preferred embodiments of the present invention.

Preferred embodiments of the present invention also are not restricted to multiplexers, transmission devices, and reception devices provided with the elastic wave filters and inductance elements having the features described above, and also may include an impedance matching method of a multiplexer, having the following steps as components including such features.

Figure 14:
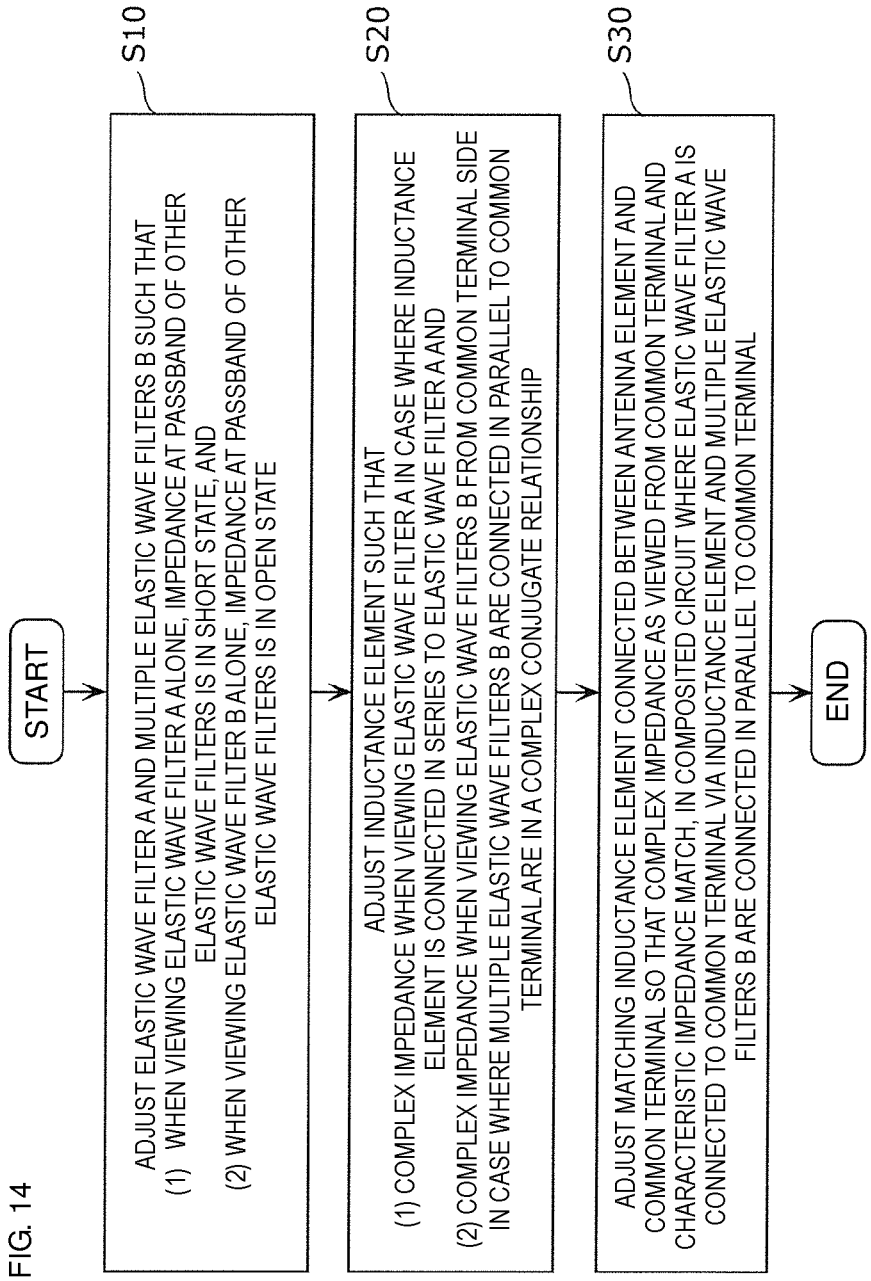
FIG. 14 is an operation flowchart describing a multiplexer impedance matching method according to a preferred embodiment of the present invention.

FIG. 14 is an operational flowchart for describing an impedance matching method of a multiplexer according to a preferred embodiment of the present invention.

An impedance matching method of a multiplexer according to the present preferred embodiment includes (1) adjusting a plurality of elastic wave filters with passbands that are different from each other, such that when viewing one elastic wave filter (elastic wave filter A) from one of the input terminal and the output terminal of the one elastic wave filter, complex impedance at passbands of other elastic wave filters (elastic wave filters B) is in a shorted state, and when viewing elastic wave filters other than the one elastic wave filter from one of the input terminal and the output terminal of the other elastic wave filters alone, complex impedance at passbands of the other elastic wave filters is in an open state (S10), (2) adjusting inductance values of a filter matching inductance element such that complex impedance when the filter matching inductance element is connected in series to the one elastic wave filter (elastic wave filter A), when viewing the one elastic wave filter from the filter matching inductance element side, and complex impedance when elastic wave filters (multiple elastic wave filters B) other than the one elastic wave filter are connected in parallel to the common terminal, when viewing the other elastic wave filters from the common terminal side, are in a complex conjugate relationship (S20), and (3) adjusting, in a compositing circuit in which the one elastic wave filter (elastic wave filter A) is connected to the common terminal via the filter matching inductance element and the other elastic wave filters (multiple elastic wave filters B) are connected to the common terminal in parallel, at least one first circuit element connected between a connection path of the antenna element and the common terminal, and a reference terminal, and at least one second circuit element connected in series to the connection path of the antenna element and the common terminal, such that complex impedance when viewed from the common terminal matches a characteristic impedance (S30).

The first circuit element and second circuit element are each preferably an antenna matching inductance element or an antenna matching capacitance element, for example. In this case, adjustment of the first circuit element and the second circuit element may be adjustment of the inductance value of the antenna matching inductance element and adjustment of the capacitance value of the antenna matching capacitance element. Further, adjustment of the first circuit element and the second circuit element may include changing types, characteristics, connection positions, and combination, for example, of the first circuit element and the second circuit element.

Further, in the adjusting of the plurality of elastic wave filters, of the plurality of elastic wave filters including at least one of a series resonator including an IDT electrode provided on a piezoelectric substrate and connected between an input terminal and an output terminal, and a parallel resonator including an IDT electrode provided on a piezoelectric substrate and connected between a connection path connecting the input terminal and the output terminal and a reference terminal, at the one elastic wave filter, the parallel resonator and the series resonator are arrayed with the parallel resonator connected to the filter matching inductance element, and at the other elastic wave filters the parallel resonator and the series resonator are arrayed with the series resonator connected to the common terminal.

According to this configuration, freedom in impedance matching is able to be improved by adjusting the first circuit element and the second circuit element as described above. Thus, even when the characteristic impedance differs between the transmission terminal or the reception terminal of the elastic wave filter side and the antenna terminal side, sufficient impedance matching is able to be performed for each terminal.

Surface acoustic wave filters including IDT electrodes have been exemplified in the preferred embodiments described above as a transmission-side filter and a reception-side filter defining a multiplexer, a quadplexer, a transmission device, and a reception device. However, the filters defining the multiplexers, the quadplexers, the transmission devices, and the reception devices according to preferred embodiments of the present invention may be elastic wave filters using elastic boundary waves or bulk acoustic waves (BAW) including series resonators and parallel resonators. Accordingly, the same or substantially the same advantages as those of the multiplexers, the quadplexers, the transmission devices, and the reception devices according to the above-described preferred embodiments are able to be obtained.

Also, while the multiplexer 1 according to the above-described preferred embodiments has been exemplarily illustrated as a configuration in which the inductance element 21 is connected in series to the reception-side filter 12, configurations in which the inductance element 21 is connected in series to the transmission-side filters 11 or 13 or the reception-side filter 14 are also included in the present invention. That is to say, the multiplexers according to preferred embodiments of the present invention may include a plurality of elastic wave filters with passbands different from each other, a common terminal, regarding which at least one first circuit element is connected between a connection path of the common terminal and the antenna element, and a reference terminal, and at least one second circuit element is connected in series to the connection path of the common terminal and the antenna element, and a first inductance element, in which, of the plurality of elastic wave filters, a transmission-side filter includes an output terminal connected to the common terminal via the first inductance element connected to this output terminal and the common terminal, and also connected to a parallel resonator, and elastic wave filters other than the transmission-side filter include, of their input terminal and output terminal, the terminal toward the side of the antenna element connected to the common terminal, and also connected to, of a series resonator and a parallel resonator, a series resonator. Thus, even when the characteristic impedance differs between the transmission terminal side or the reception terminal side of the elastic wave filter and the antenna terminal side, sufficient impedance matching is able to be performed for each terminal. Accordingly, a low-loss multiplexer is able to be provided even if the number of bands and the number of modes to be handled are increased.

Preferred embodiments of the present invention are broadly applicable to communication devices, such as cellular phones, as a low-loss multiplexer, a transmission device, and a reception device applicable to multi-band and multi-mode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer that transmits and receives high-frequency signals via an antenna element, the multiplexer comprising:
    a plurality of elastic wave filters with passbands different from each other;
    a common terminal;
    a first inductance element connected in series between the common terminal and one elastic wave filter of the plurality of elastic wave filters;
    a second inductance element connected between the antenna element and the common terminal; wherein
    each of the plurality of elastic wave filters includes:
        a series resonator connected between an input terminal and an output terminal; and
        a parallel resonator connected between a connection path connecting the input terminal and the output terminal and a reference terminal;
    in the one elastic wave filter of the plurality of elastic wave filters, one of the input terminal and the output terminal of the one elastic wave filter that is closer to the antenna element is connected to the common terminal via the first inductance element, and the one of the input terminal and the output terminal closer to the antenna element is connected to the parallel resonator; and
    in each of the plurality of elastic wave filters other than the one elastic wave filter, one of the input terminal and the output terminal of the elastic wave filter that is closer to the antenna element is connected to the common terminal and to the series resonator.

2. The multiplexer according to claim 1, wherein in one of the plurality of elastic wave filters other than the one elastic wave filter, a third inductance element is connected between the series resonator and the input terminal or the output terminal opposite to the one of the input terminal and the output terminal closer to the antenna element.

3. The multiplexer according to claim 2, wherein in one of the plurality of elastic wave filters other than the one elastic wave filter, a fourth inductance element is connected between the parallel resonator and the reference terminal.

4. The multiplexer according to claim 1, wherein the second inductance element is connected in series between the antenna element and the common terminal.

5. The multiplexer according to claim 1, wherein at least one of the plurality of elastic wave filters includes a plurality of parallel resonators connected between the connection path and the reference terminal.

6. The multiplexer according to claim 5, wherein in the at least one of the plurality of elastic wave filters that includes the plurality of parallel resonators, at least two of the plurality of parallel resonators are connected at a common contact point, and a third inductance element is connected between the common contact point and the reference terminal.

7. The multiplexer according to claim 1, wherein the one elastic wave filter is a reception filter for Band 25.

8. The multiplexer according to claim 1, wherein one of the plurality of elastic wave filters other than the one elastic wave filter is a transmission filter for Band 25.

9. The multiplexer according to claim 1, wherein one of the plurality of elastic wave filters other than the one elastic wave filter is a transmission filter for Band 66.

10. The multiplexer according to claim 1, wherein one of the plurality of elastic wave filters other than the one elastic wave filter is a reception filter for Band 66.

* * * * *